(12) United States Patent  (10) Patent No.: US 6,697,278 B2
Nagamine et al.  (45) Date of Patent: Feb. 24, 2004

(54) SEMICONDUCTOR MEMORY DEVICE

(75) Inventors: Hisayuki Nagamine, Kanagawa (JP); Akitomo Nakayama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/262,095

(22) Filed: Oct. 1, 2002

(65) Prior Publication Data

US 2003/0067813 A1 Apr. 10, 2003

(30) Foreign Application Priority Data

Oct. 5, 2001 (JP) .......................................... 2001-310196

(51) Int. Cl.$^7$ ................................................. G11C 5/06
(52) U.S. Cl. ............................................. 365/63; 365/51
(58) Field of Search ............................. 365/63, 51, 225, 365/189.01

(56) References Cited

U.S. PATENT DOCUMENTS 5,917,763 A * 6/1999 Mullarky .................... 365/200
6,278,649 B1 * 8/2001 Lee et al. ............... 365/230.03
6,347,367 B1 * 2/2002 Dell et al. .................. 711/170

* cited by examiner

*Primary Examiner*—Son T. Dinh
(74) *Attorney, Agent, or Firm*—Darryl G. Walker; Bradley T. Sako

(57) ABSTRACT

A semiconductor memory device (100) has been disclosed. A semiconductor memory device (100) may include a select circuit region (31), a reading circuit region (33), and a memory cell array region (30). Memory cell array region (30) may include proximal memory cells (11A) and distal memory cells (11B) with respect to a select circuit region (31) or a reading circuit region (33). Distal memory cells (11B) have a current drive characteristic that may be greater than a current drive characteristic of proximal memory cells (11A). In this way, compensation may be provided and a data propagation delay difference due to parasitic values may be decreased.

20 Claims, 22 Drawing Sheets

(a) DESIGN REFERENCE MINIMUM VALUE (b) MINIMUM DESIGN REFERENCE (a)

(b)

(c)

(a)

(b)

SEMICONDUCTOR MEMORY DEVICE

TECHNICAL FIELD

The present invention relates generally to a semiconductor memory device such as a SRAM (Static Random Access Memory) and more particularly to semiconductor memory device that may be capable of reducing a propagation time difference among all memory cells in a memory cell region.

BACKGROUND OF THE INVENTION

In a semiconductor memory device such as a SRAM (Static Random Access Memory), it is desirable to provide a large memory capacity, high-speed operation, reduced manufacturing costs, and the like. In order to provide these features, miniaturization of the semiconductor device components is rapidly being advanced.

Referring now to FIG. 30, a circuit schematic diagram of a conventional semiconductor memory device is set forth and given the general reference character 10. Conventional semiconductor memory device 10 is a SRAM and includes word lines (WL1 to WLn) extending in a row direction and bit lines (BL1–BLm and /BL1–/BLm) extending in a column direction. A plurality of memory cells 11 are placed at intersections of word lines WL and bit lines (BL and /BL) to form a matrix pattern. Conventional semiconductor memory device 10 includes a plurality of select circuits 12 and a plurality of reading circuits 13. Each select circuit 12 is connected to an associated word line WL. Each reading circuit 13 is connected to an associated bit line pair (BL and /BL). Bit lines (BL1–BLm and /BL1–/BLm) form bit line pairs, where BL indicates a true bit line and /BL indicates a complement bit line in a bit line pair ("/" indicates an inversion signal).

In semiconductor memory device 10, select circuit 12 provides a select signal on a word line WL to select a memory cell 11. Data (memory information) is read from the selected memory cell 11 by a reading circuit 13 connected to a bit line pair (BL and /BL). The distance from the memory cell 11 to a select circuit 12 and/or a reading circuit 13 varies depending on the location of the memory cell 11 selected. For that reason, when a select signal is to be transmitted to a group of memory cells 11 connected to the same word line WL, the timing of the memory cell 11 providing data (response speed) to a bit line pair (BL and /BL) varies between memory cells 11 of the group that are positioned far from the select circuit 12 (hereinafter referred to as distal side) and memory cells 11 of the group that are positioned near the select circuit 12 (hereinafter referred to as proximal side). A difference in response speed corresponds to a delay time due to parasitics (resistance and capacitance) or the word line WL. As a result, the reading speed between memory cells 11 varies.

Similarly, of a group of memory cells 11 connected to the same bit line pair (BL and /BL), the reading speed is varied due to bit line parasitics (resistance and capacitance) between distal side memory cells 11 and proximal side memory cells 11 with respect to a corresponding reading circuit 13. Accordingly, semiconductor memory device 10 is designed based on data propagation time of distal side memory cells 11 in order to avoid malfunction irrespective of whether the selected memory cell is a distal side memory cell 11 or a proximal side memory cell 11.

A more detailed description of problems of a conventional semiconductor memory device will now be given using a reading circuit in an SRAM as an example.

Referring now to FIG. 31, a circuit schematic diagram of a conventional memory cell block is set forth. The conventional memory cell block has n memory cells 11 that are connected to the same reading circuit 13 through a bit line pair (BL and /BL). The distance from reading circuit 13 is different for each memory cell 11. The parasitic resistance and parasitic capacitance of bit line pair (BL and /BL) causes the propagation time of data to vary from one memory cell 11 to another memory cell 11. The timing T of an activation signal for reading circuit 13 is set for a worst case memory cell 11 to provide an electrical potential difference ΔV necessary at bit line pair (BL and /BL) for a normal operation of reading circuit 13. In this case, the worst case memory cell 11 can be the distal memory cell 11 with respect to reading circuit 13.

The delay of data signal transmission due to differences in distance from reading circuit 13 in a conventional memory cell block will now be described with reference to FIG. 32. FIG. 32(a) is a circuit schematic diagram of a conventional memory cell block illustrating current paths. FIG. 32(b) is a waveform diagram showing the electric potential waveform of bit lines when a proximal side memory cell is selected. FIG. 32(c) is a waveform diagram showing the electric potential waveform of bit lines when a distal side memory cell is selected.

As shown in FIG. 32(a), a proximal memory cell $11_1$ with respect to reading circuit 13 sets the electric potential difference between bit line pair (BL and /BL) to ΔV by taking a current path indicated by an arrow b. In proximal memory cell $11_1$, as illustrated in FIG. 32(b), the electric potential ΔV is reached at an early time because the electric resistance of bit line BL from memory cell $11_1$ to reading circuit 13 is small.

On the other hand, as shown in FIG. 32(b), a distal memory cell $11_n$ with respect to reading circuit 13 sets the electric potential difference between bit line pair (BL and /BL) to ΔV by taking a current path indicated by an arrow c. In distal memory cell $11_n$, as illustrated in FIG. 32(c), the electric potential ΔV is reached at a later time T because the electric resistance of bit line BL from memory cell $11_n$ to reading circuit 13 is large. In this way, it can be seen that memory cell $11_n$ needs more time to set an electric potential between bit line pair (BL and /BL) to ΔV than proximal memory cell $11_1$.

As shown in FIG. 32(c), reading circuit 13 is controlled with a timing T at which an electric potential difference ΔV between a bit line pair (BL and /BL) is achieved for a read from distal memory cell $11_n$. Timing T is set to accommodate a worst-case scenario. Therefore, as illustrated in FIG. 32(b), when proximal memory cell $11_1$ is selected, the electric potential difference between bit line pair (BL and /BL) at time T (when reading circuit 13 is activated) is ΔV+α. In other words, setting timing T to accommodate distal memory cell $11_n$ is not optimal for proximal memory cell $11_1$ which reaches an electric potential difference ΔV earlier than timing T.

FIG. 33 illustrates a conventional approach for dividing a bit line. FIG. 33(a) is a circuit schematic diagram of a conventional memory cell block having 2n memory cells. FIG. 33(b) is a circuit schematic diagram of a conventional memory cell block obtained by dividing the number of memory cells connected to a bit line pair (BL and /BL) in two as compared to the conventional memory cell block of FIG. 33(a).

In FIG. 33(a), 2n memory cells ($11_1$ to $11_{2n}$) are connected to bit line pair (BL and /BL). In FIG. 33(b), each bit line pair (of FIG. 33(a)) is divided so that only n memory cells of the 2n memory cells are connected to each divided bit line pair (BL and /BL) so that time to propagate data to reading circuit 13 from a distal memory cell $11_n$ becomes closer to the time to propagate data to reading circuit 13 from a proximal memory cell $11_1$.

In the example illustrated in FIG. 33(b), each bit line is divided to make the distal memory cell $11_n$ closer to the proximal memory cell $11_1$ to reduce the difference in data propagation time to reading circuit 13. However, the number of reading circuits 13 required has to be increased in accordance with the division multiple of the bit line (in this case, the number of reading circuits 13 must double). The increase in the number of reading circuits 13 results in the increase in chip size and thus, increases manufacturing costs.

Another technique for improving the reading speed is disclosed in JP 10-289585 A. FIG. 34 is a circuit schematic diagram of a conventional semiconductor memory device disclosed in JP 10-289585 A. Referring now to FIG. 34, a control circuit 15 assesses the position of a memory cell 11 to be selected based on address signals ($AR_n$ and $AR_{n-1}$) and generates a select control signal based on the assessment. In response to the select control signal generated in control circuit 15, a select circuit 16 selects one of a plurality of voltages (Vref0 to Vref3) of different voltage levels and supplies the selected voltage to a memory cell array 17.

In the conventional semiconductor memory device of FIG. 34, the reading speed can be improved by setting different drive voltages in accordance with whether a proximal side memory cell 11 is selected or a distal side memory cell 11 is selected. However, the conventional semiconductor memory device of FIG. 34 needs additional circuits. Namely, control circuit 15 for assessing the position of a selected memory cell 11 and a voltage control circuit (not shown in FIG. 34) for generating different a plurality of voltages (Vref0 to Vref3) having different voltage levels. The additional circuits increase chip size and therefore can increase manufacturing costs.

As described above, conventional semiconductor memory devices of FIGS. 33 and 34 may achieve a reduction in differences in reading speeds between memory cells due to a difference in distance between memory cells a reading circuit. However, using the conventional approaches of FIGS. 33 and 34, the chip size may increase and therefore manufacturing costs may increase.

In view of the above discussion, it would be desirable to provide semiconductor memory device that may reduce the difference in reading speeds between distal side memory cells and proximal side memory cells while reducing an increase in chip size.

SUMMARY OF THE INVENTION

According to the present embodiments, a semiconductor memory device is disclosed. A semiconductor memory device may include a select circuit region, a reading circuit region, and a memory cell array region. A memory cell array region may include proximal memory cells and distal memory cells with respect to a select circuit region or a reading circuit region. Distal memory cells have a current drive characteristic that may be greater than a current drive characteristic of proximal memory cells. In this way, compensation may be provided and a data propagation delay difference due to parasitic values may be decreased.

According to one aspect of the embodiments, a semiconductor memory device may include a plurality of word lines disposed in a row direction and a plurality of bit lines disposed in a column direction. A plurality of memory cells may be placed at intersections of the plurality of word lines and the plurality of bit lines. Each memory cell may be connected to one of the plurality of word lines and one of the plurality of bit lines. Select circuits may be coupled to the word lines to select memory cells. Reading circuits may be connected to the bit lines to read data from the selected memory cells. Of a group of memory cells connected to a same one of the plurality of word lines, the current drive performance of distal side memory cells positioned far from the select circuits may be set higher than the current drive performance of proximal side memory cells positioned near the select circuits.

According to another aspect of the embodiments, a semiconductor memory device may include a plurality of word lines disposed in a row direction and a plurality of bit lines disposed in a column direction. A plurality of memory cells may be placed at intersections of the plurality of word lines and the plurality of bit lines. Each memory cell may be connected to one of the plurality of word lined and one of the plurality of bit lines. Select circuits may be coupled to the word lines to select memory cells. Reading circuits may be connected to the bit lines to read data from the selected memory cells. Of a group of memory cells connected to a same one of the plurality of bit lines, the current drive performance of distal side memory cells positioned far from the reading circuits may be set higher than the current drive performance of proximal side memory cells positioned near the reading circuits.

According to another aspect of the embodiments, each distal side memory cell may include insulated gate field effect transistors (IGFETs) that may have a larger gate width than corresponding IGFETs in the proximal side memory cells.

According to another aspect of the embodiments, each distal side memory cell may include IGFETs that may have a shorter gate length than corresponding IGFETs in the proximal side memory cells.

According to another aspect of the embodiments, each distal side memory cell may include IGFETs that may have channel regions doped with an impurity at a different impurity concentration than corresponding IGFETs in the proximal side memory cells.

According to another aspect of the embodiments, the impurity may include boron and the impurity concentration may be lower in the IGFETs in the distal side memory cells than in the corresponding IGFETs in the proximal side memory cells.

According to another aspect of the embodiments, the impurity may include phosphorus and the impurity concentration may be higher in the IGFETs in the distal side memory cells than in the corresponding IGFETs in the proximal side memory cells.

According to another aspect of the embodiments, the plurality of memory cells may be included in a memory cell array region. A connection adjusting region may be provided between the memory cell array region and the select circuits. The connection adjusting region may connect wires included in each select circuit with wires included in the memory cell array region after adjusting the positions of the wire in accordance with a pitch of the memory cells.

According to another aspect of the embodiments, the plurality of memory cells may be included in a memory cell array region. A connection adjusting region may be provided between the memory cell array region and the reading circuits. The connection adjusting region may connect wires included in each reading circuit with wires included in the memory cell array region after adjusting the positions of the wire in accordance with a pitch of the memory cells.

According to another aspect of the embodiments, a semiconductor memory device may include an output circuit coupled to receive data from a plurality of memory cell array regions. The plurality of memory cell array regions may include a proximal memory cell array region and a distal memory cell array region with respect to the output circuit. The proximal memory cell array region may include a plurality of proximal memory cells and the distal memory cell array region may include a plurality of distal memory cells. The current drive performance of the distal memory cells may be set higher than the current drive performance of proximal memory cells.

According to another aspect of the embodiments, each of the plurality of distal memory cells may have a pitch in a bit line direction larger than the pitch in a bit line direction of each of the plurality of proximal memory cells.

According to another aspect of the embodiments, each of the plurality of distal memory cells may have a pitch in a word line direction larger than the pitch in a word line direction of each of the plurality of proximal memory cells.

According to another aspect of the embodiments, each distal memory cell may include IGFETs that may have a larger gate width than corresponding IGFETs in the proximal memory cells.

According to another aspect of the embodiments, the semiconductor memory device may be a static random access memory (SRAM).

According to another aspect of the embodiments, each distal memory cell may include IGFETs that may have channel regions doped with an impurity at a different impurity concentration than corresponding IGFETs in the proximal memory cells.

DETAILED DESCRIPTION OF THE EMBODIMENTS

Various embodiments of the present invention will now be described in detail with reference to a number of drawings.

Figure 1:
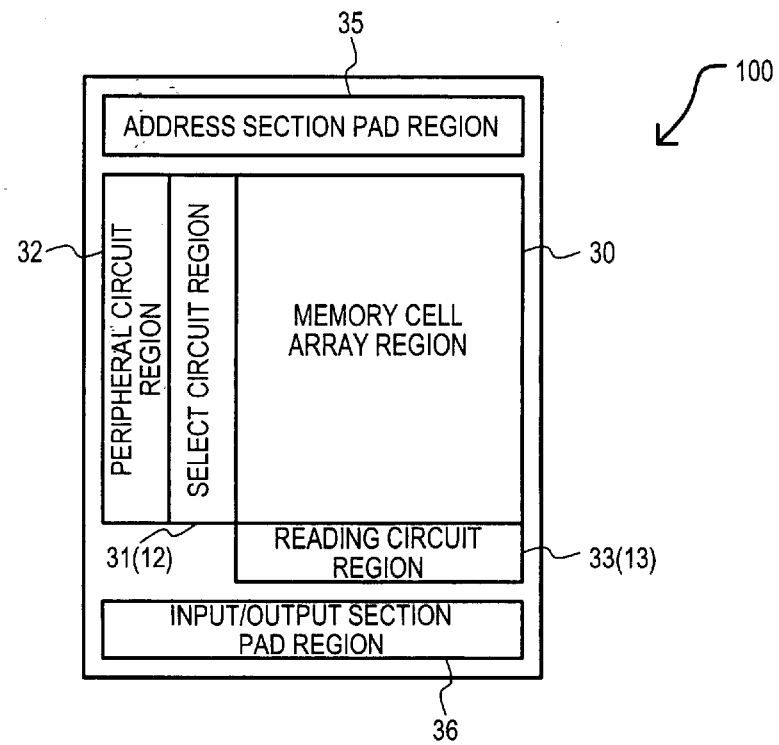
FIG. 1 is a plan view of a semiconductor memory device according to an embodiment.

Referring now to FIG. 1, a plan view of a semiconductor memory device according to an embodiment and given the general reference character 100. The present invention may be applicable to all kinds of semiconductor memory devices including memory cell arrays.

Semiconductor memory device 100 may include a memory cell array region 30, a select circuit region 31, a peripheral circuit region 32, a reading circuit region 33, an address section pad region 35, and an input/output section pad region 36. Select circuit region 31 may be adjacent to one side of memory cell array region 30. Peripheral circuit region 32 may be adjacent to select circuit region 31. Reading circuit region 33 may be adjacent to another side of memory cell array region 30. Input/output section pad region 36 may be adjacent to reading circuit region 33. Address section pad region 35 may be on an opposite side of memory cell array region 30 as input/output section pad region 36.

Figure 30:
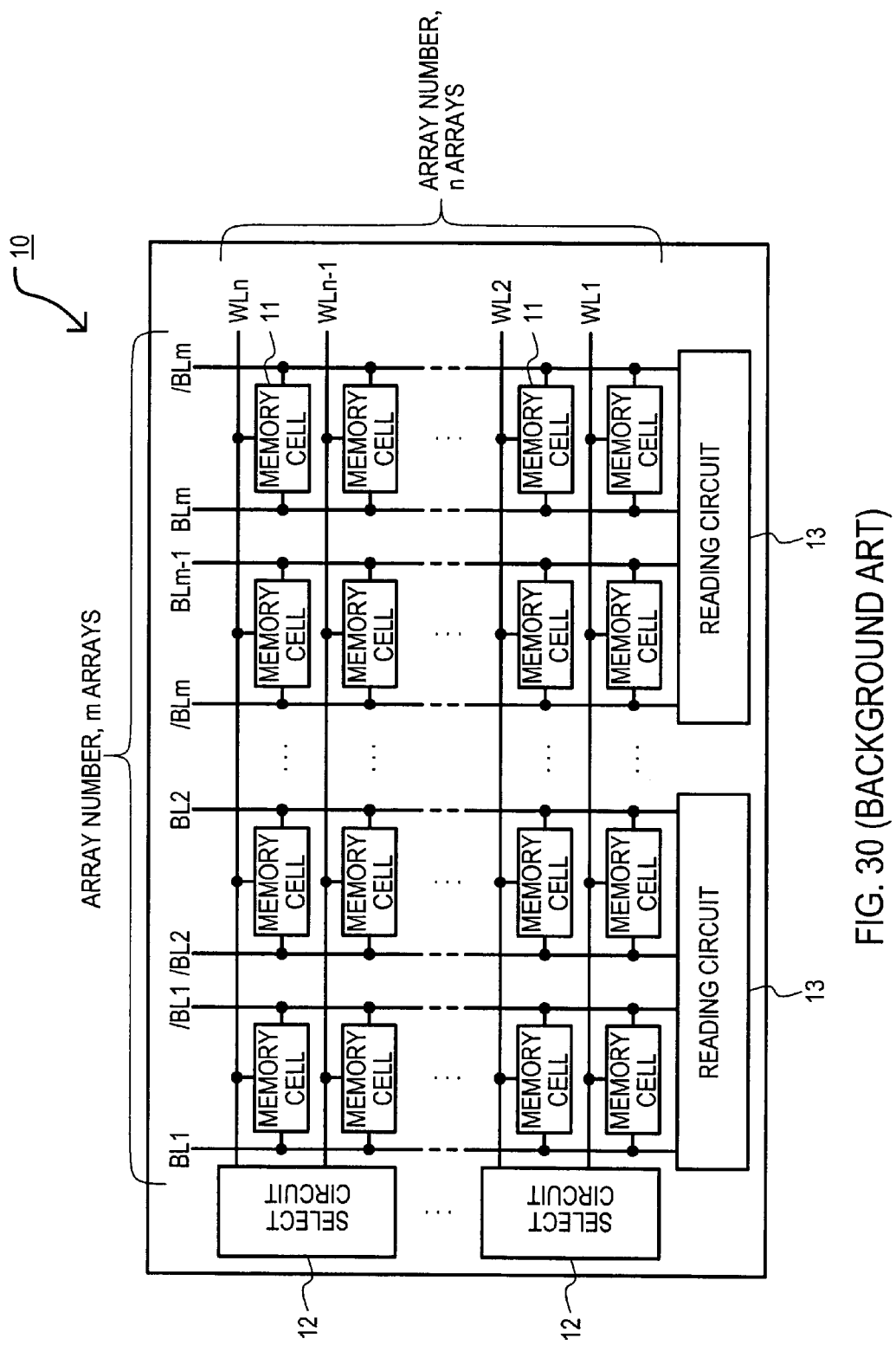
FIG. 30 is a circuit schematic diagram of a conventional semiconductor memory device.
Figure 31:
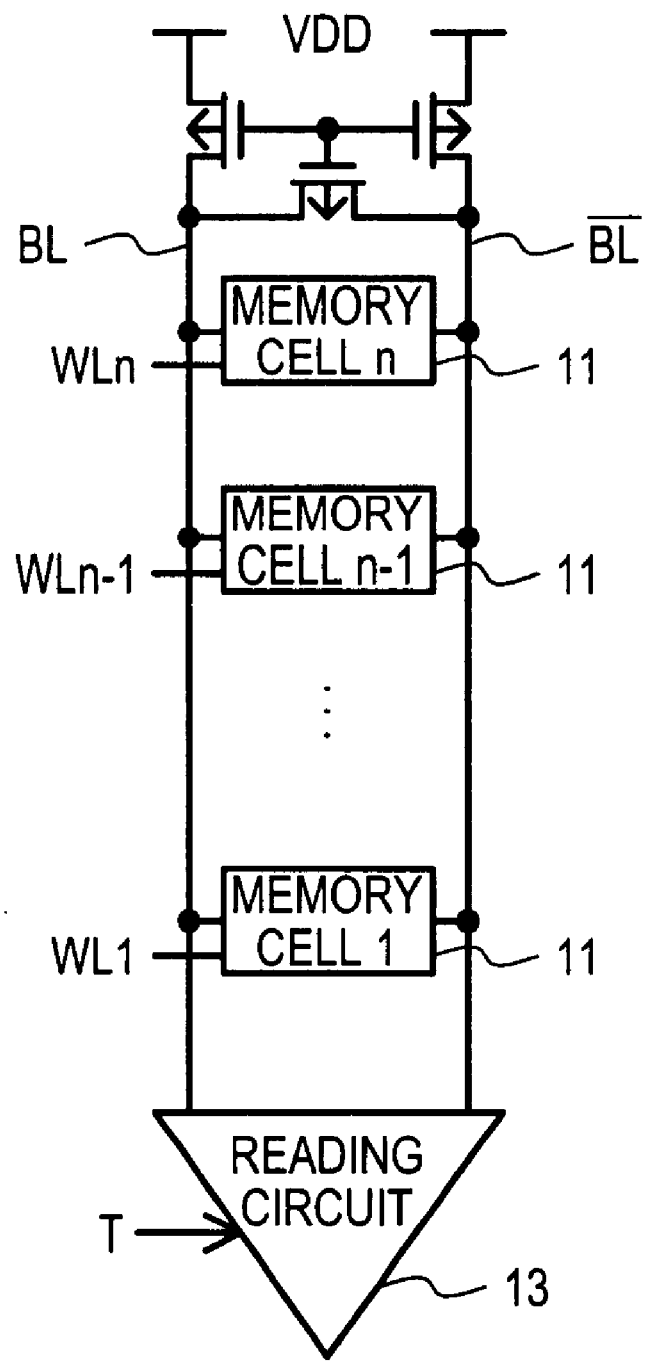
FIG. 31 is a circuit schematic diagram of a conventional memory cell block.
Figure 32:
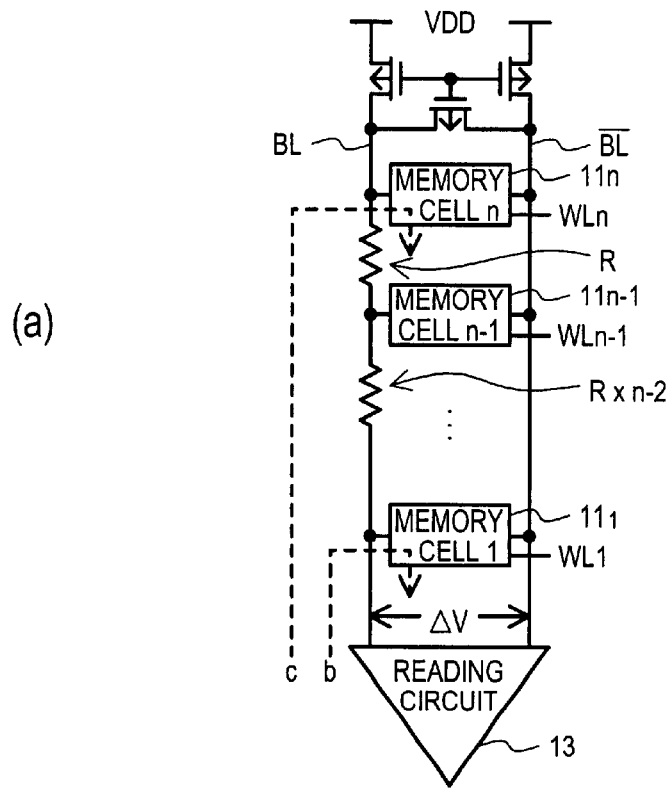
FIG. 32(a) is a circuit schematic diagram of a conventional memory cell block illustrating current paths.
FIG. 32(b) is a waveform diagram showing the electric potential waveform of bit lines when a proximal side memory cell is selected.
FIG. 32(c) is a waveform diagram showing the electric potential waveform of bit lines when a distal side memory cell is selected.
Figure 32:
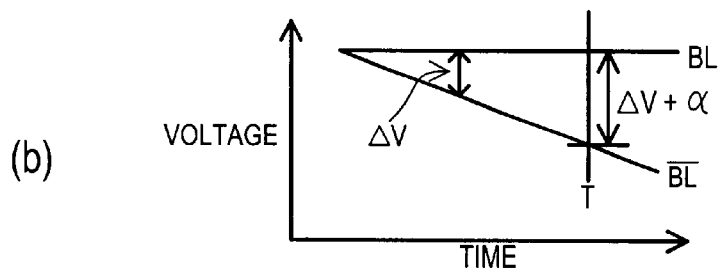
Figure 32:
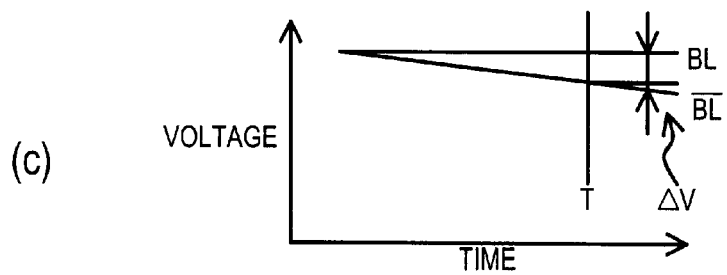
Figure 33:
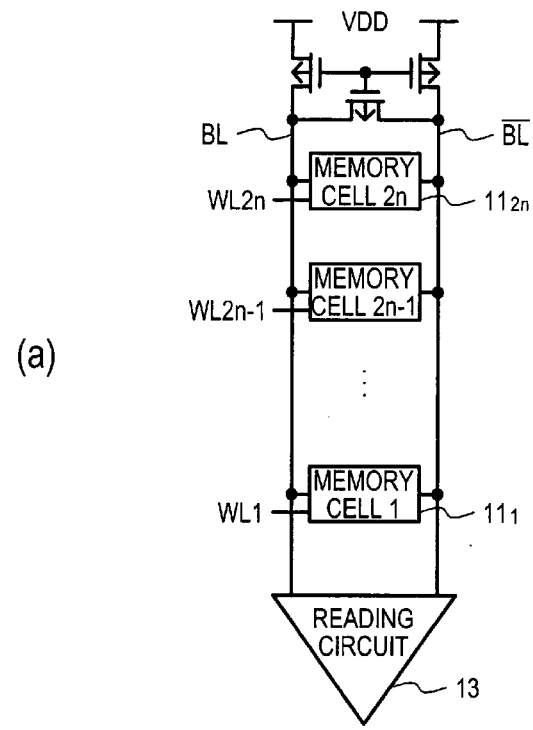
FIGS. 33(a) and 33(b) are circuit schematic diagrams illustrating a conventional approach for dividing a bit line.
Figure 33:
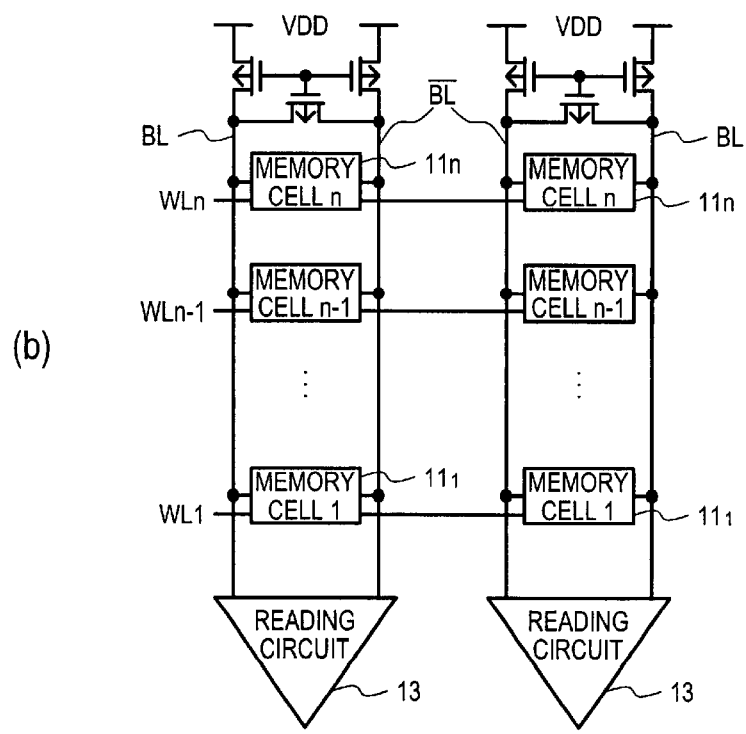
Figure 34:
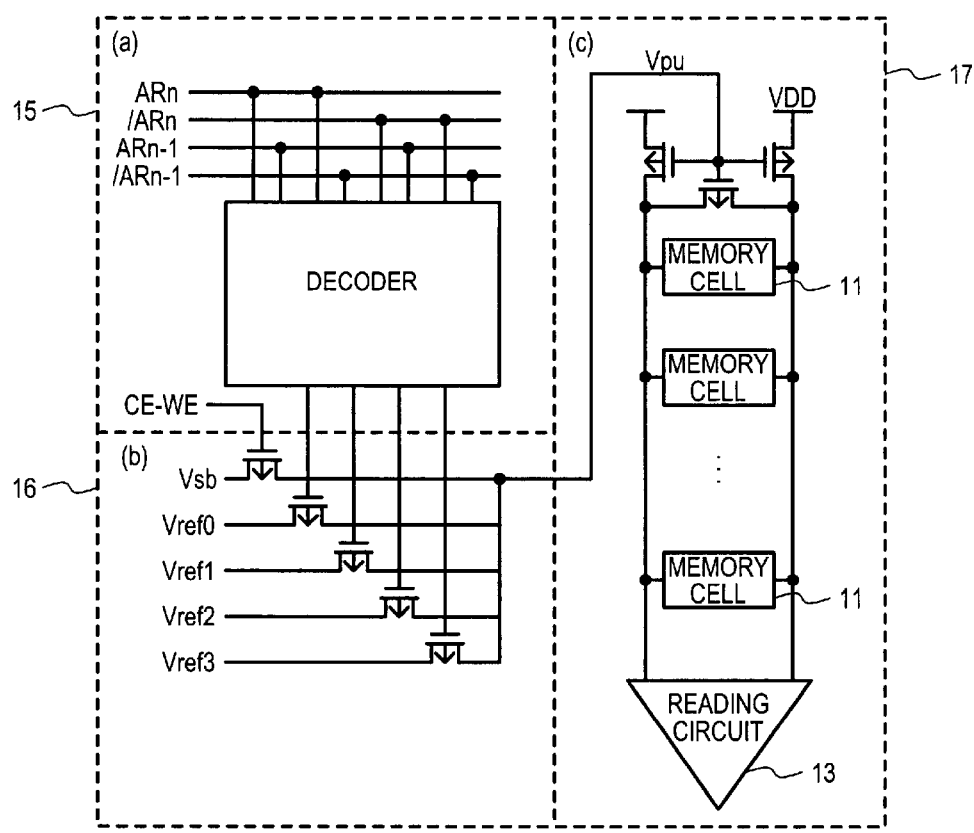
FIG. 34 is a circuit schematic diagram of a conventional semiconductor memory device.

The construction of memory cell region 30 may be similar to memory cell region 10 of FIG. 30. Memory cells 11 may be connected to a bit line pair (BL and /BL). The number of memory cells 11 connected to a bit line pair (BL and /BL) may be determined in accordance with the number of reading circuits 13 provided in reading circuit region 33. Memory cells 11 may be connected to their respective select circuits 12 through n word lines (WL1 to WLn) extending in the row direction in memory cell array region 30.

In semiconductor memory device 100, a select signal may be provided to a word line WL from a select circuit 12 in select circuit region 31 in response to a signal provided from address section pad region 35. Memory cell 11 in memory cell array region 30 may be selected in response to the select signal. In this way, data may be read from a selected memory cell 11 by a reading circuit 13 in reading circuit region 33. This data may be transmitted to input/output section pad region 36.

Figure 2:
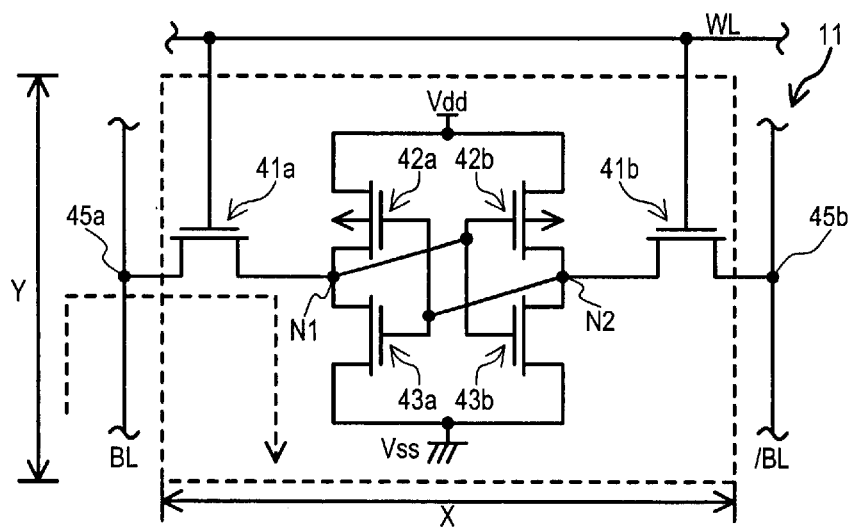
FIG. 2 is a circuit schematic diagram of a memory cell according to an embodiment.

Referring now to FIG. 2, a circuit schematic diagram of a memory cell according to an embodiment is set forth and given the general reference character 11. Memory cell 11 may be a single memory cell storing one bit of data. Memory cell 11 may include n-type insulated gate field effect transistors (IGFETs) (41a and 41b) for connecting a bit line pair (BL and /BL) to a flip-flop. N-type IGFETs (41a and 41b) may be used for selecting memory cell 11. N-type IGFET 41a may have a first source/drain connected to bit line BL through a contact plug 45a, a gate connected to a word line WL, and a second source/drain connected to a memory node N1. N-type IGFET 41b may have a first source/drain connected to complementary bit line /BL through a contact plug 45b, a gate connected to a word line WL, and a second source/drain connected to a memory node N2.

A flip-flop circuit may include n-type IGFETs (43a and 43b) and p-type IGFETs (42a and 42b). N-type IGFET 43a may have a source connected to a ground potential line Vss, a drain connected to memory node N1, and a gate connected to memory node N2. N-type IGFET 43b may have a source connected to a ground potential line Vss, a drain connected to memory node N2, and a gate connected to memory node N1. P-type IGFET 42a may have a source connected to a power supply electric potential line Vdd, a drain connected to memory node N1, and a gate connected to memory node N2. P-type IGFET 42b may have a source connected to a power supply electric potential line Vdd, a drain connected to memory node N2, and a gate connected to memory node N1.

P-type IGFETs (42a and 42b) may serve as load devices for memory cell 11. N-type IGFETs (43a and 43b) may serve as drive devices for memory cell 11. P-type IGFETs (42a and 42b) may provide minute amounts of current to memory nodes (N1 and N2), respectively, in order to hold data in memory cell 11. N-type IGFETs (43a and 43b) may provide a drive current through n-type IGFETs (45a and 45b) to drive bit line pair (BL and /BL) when memory cell 11 is selected.

N-type IGFETs (41a, 41b, 43a, and 43b) may be n-type MOSFETs. P-type IGFETs (42a, and 42b) may be p-type MOSFETs.

Figure 3:
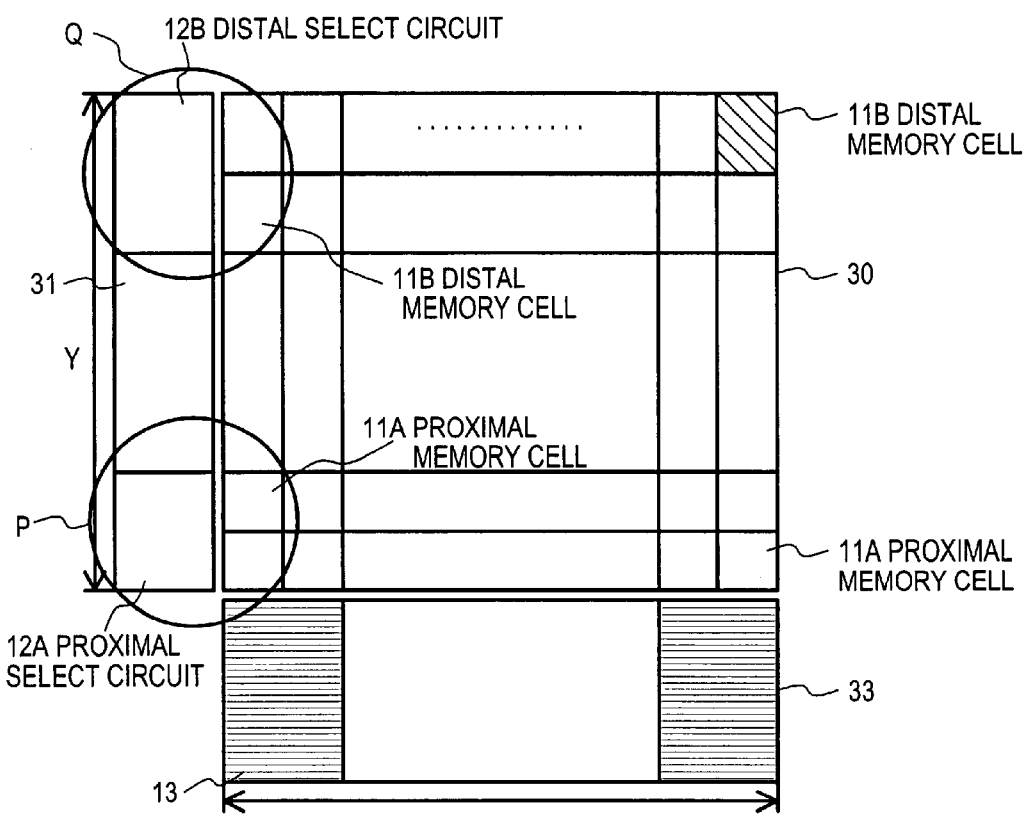
FIG. 3 is a plan view illustrating a mask image of a portion semiconductor memory device according to an embodiment.

Referring now to FIG. 3, a plan view illustrating a mask image of a portion semiconductor memory device 100 according to an embodiment is set forth. The mask image of FIG. 3 may essentially correspond to the equivalent circuit diagram shown in FIG. 30. Peripheral circuit region 32, address section pad region 35, and input/output section pad region 36 shown in FIG. 1 are omitted from FIG. 3 to avoid unduly cluttering the figure. The plan view of FIG. 3 may have similar constituents to semiconductor memory device 100 of FIG. 1 and such constituents may be given the same reference character.

FIG. 3 may illustrate an arrangement of proximal memory cells 11A and distal memory cells 11B with respect to reading circuit region 33. Proximal memory cells 11A may be nearer reading circuit region 33 as compared to distal memory cells 11B. Select circuit region 31 may include a proximal select circuit 12A and a distal select circuit 12B. Proximal select circuit 12A may provide selection signals to proximal memory cells 11A and distal select circuit 12B may provide selection signals to distal memory cells 11B.

As could be understood from FIG. 3, "a proximal memory cell" with respect to select circuit 12 may indicate a memory cell 11 that is closest to select circuit 12. On the other hand, "proximal memory cells" may mean memory cells in a region which is close to the select circuit 12 and which exerts a specific influence on reading circuit characteristics. Memory cells 11 in this region may indicate the ⅓ to ⅔ closest memory cells 11 to select circuit 12 out of a group of memory cells 11 connected to the same word line WL, for example. "A distal memory cell" with respect to select circuit 12 may indicate a memory cell 11 that is farthest to select circuit 12. On the other hand, "distal memory cells" may mean memory cells in a region which is far from the select circuit 12 and which exerts a specific influence on reading circuit characteristics. Memory cells 11 in this region may indicate the ⅓ to ⅔ farthest memory cells 11 from select circuit 12 out of a group of memory cells 11 connected to the same word line WL, for example.

Figure 4:
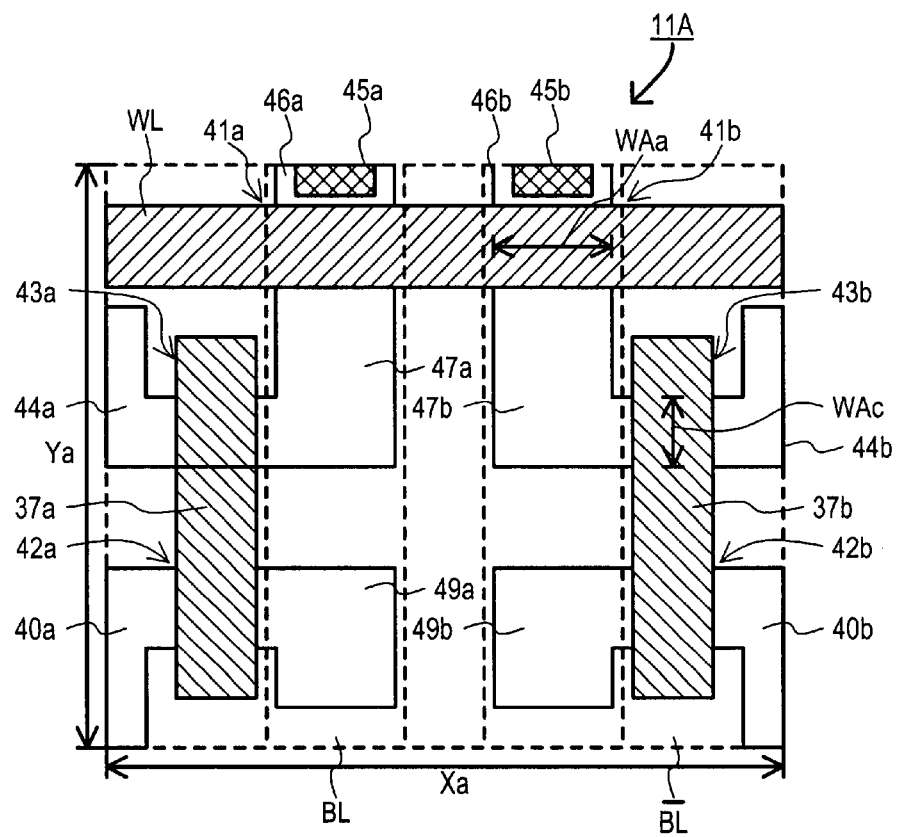
FIG. 4 is a plan view of mask pattern images of a proximal memory cell of FIG. 3. according to an embodiment.
Figure 6:
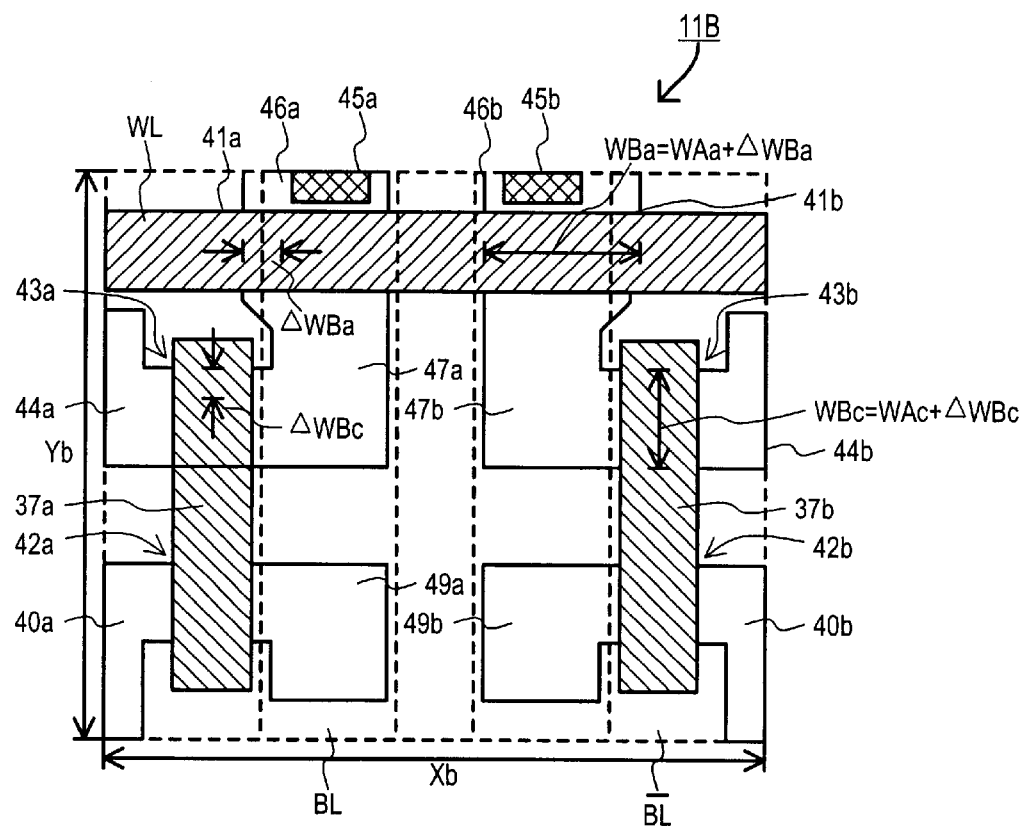
FIG. 6 is a plan view of mask pattern images of a distal memory cell of FIG. 3. according to an embodiment.

FIG. 4 is a plan view of mask pattern images of a proximal memory cell 11A of FIG. 3. The mask pattern of FIG. 4 may correspond to a circuit diagram of a memory cell as illustrated in FIG. 2. FIG. 6 is a plan view of mask pattern images of a distal memory cell 11A of FIG. 3. The mask pattern of FIG. 6 may correspond to a circuit diagram of a memory cell as illustrated in FIG. 2. Proximal memory cell 11A and distal memory cell 11B may include common components that are referred to by the same reference characters. Proximal memory cell 11A and distal memory cell 11B may have N-type diffusion layers and P-type diffusion layers formed at the four corners of a rectangular region. The N-type diffusion layers may have source diffusion regions (44a, 46a, 44b, and 46b) and drain diffusion regions 47a and 47b). The P-type diffusion layer may have source diffusion regions (40a and 40b) and drain diffusion regions (49a and 49b). Channel regions (under gate electrodes) may be formed between source diffusion region 40a and drain diffusion region 49a, between source diffusion region 44a and drain diffusion region 47a, between source diffusion region 40b and drain diffusion region 49b, between source diffusion region 44b and drain diffusion region 47b, between source diffusion region 46a and drain diffusion region 47a, and between source diffusion region 46b and drain diffusion region 47b.

A word line WL may extend in a direction indicated by arrow Xa in FIG. 4 and arrow Xb FIG. 6. Word line WL may cross as gate electrodes above channel regions between source diffusion region 46a and drain diffusion region 47a and between source diffusion region 46b and drain diffusion region 47b to form n-type IGFETs (41a and 41b). Gate polysilicon wires (37a and 37b) may extend in parallel to each other in a direction indicated by arrow Ya in FIG. 4 and by arrow Yb in FIG. 6. Gate polysilicon wire 37a may cross as gate electrodes above channel regions between source diffusion region 44a and drain diffusion region 47a and between source diffusion region 40a and drain diffusion region 49a to form n-channel IGFETs and p-channel IGFETs (43a and 42a), respectively.

Gate polysilicon wire 37b may cross as gate electrodes above channel regions between source diffusion region 44b and drain diffusion region 47b and between source diffusion region 40b and drain diffusion region 49b to form n-channel IGFETs (43b and 42b), respectively. Bit lines (BL and /BL) may extend in parallel to gate polysilicon wires (37a and 37b). Bit lines (BL and /BL) may be connected to source diffusion regions (46a and 46b) of n-type IGFETs (41a and 41b) through contact plugs (45a and 45b), respectively.

Figure 5:
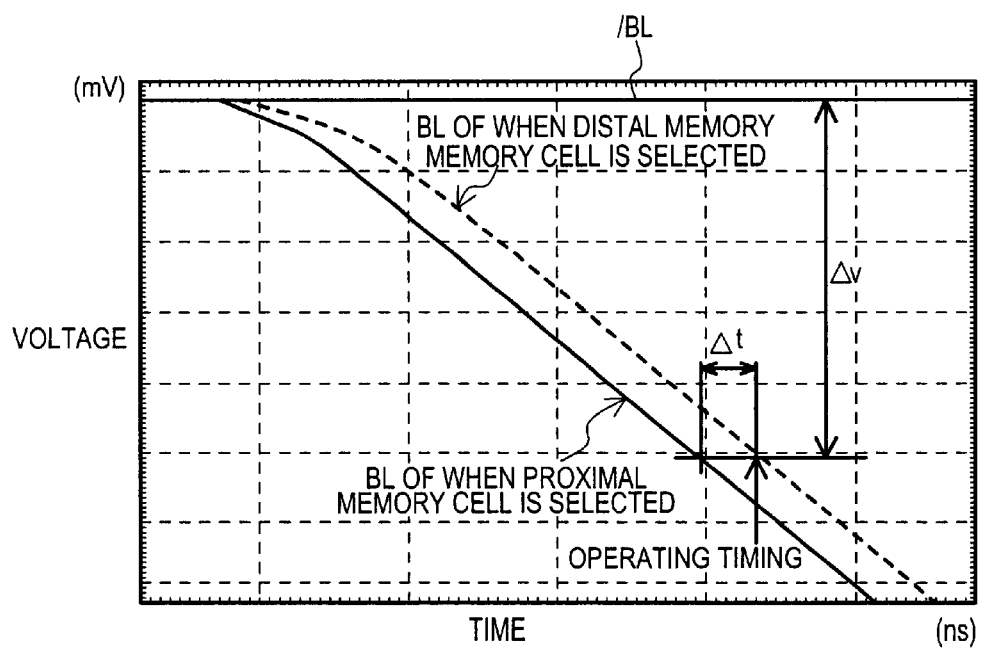
FIG. 5 is a timing diagram illustrating a difference Δt in the operating timing when a potential difference ΔV is provided on a bit line pair when conventional memory cells are provided for both distal and proximal memory cells in memory cell array region.

FIG. 5 is a timing diagram illustrating a difference Δt in the operating timing when a potential difference ΔV is provided on bit line pair (BL and /BL) when conventional memory cells 11 are provided for both distal and proximal memory cells in memory cell array region 30. It is understood from the graph that the potential difference ΔV between bit line pair (BL and /BL) which can be necessary for normal operation of reading circuit 13 is obtained with a delay of a data propagation time Δt for a distal memory cell 11 compared to a signal waveform with a proximal memory cell 11 close to reading circuit is selected.

The propagation delay time Δt is caused by a parasitic resistance of a bit line being a value that is not negligible when compared to an equivalent resistance of a load element or the like, due to enlargement of memory capacity and miniaturization of a process. The maximum theoretical operating speed can be provided for a proximal memory cell by providing the operation timing of the reading circuit 13 at a time T when a potential difference ΔV is provided on the bit line pair (BL and /BL). Therefore, in order to improve the overall operation speed of the semiconductor memory device, the waveform of the distal memory cell far from the reading circuit 13 has to reach a potential difference ΔV at time T which requires a time improvement of Δt.

In order to do so, in memory cell 11 of a semiconductor memory device (such as an SRAM) illustrated in FIG. 2, the current drive performance of n-type IGFETs (41a and 41b) and n-type IGFETs (43a and 43b) for a distal memory cell may be raised to improve the memory cell driving characteristics. In this way, the data propagation delay time Δt may be reduced. However, the current drive performance of n-type IGFETs (41a and 41b) and n-type IGFETs (43a and 43b) may need to keep the same ratios as originally designed in order to prevent destroying data in a distal memory cell 11 during reading.

Referring to FIG. 3, proximal memory cell 11A of FIG. 4 may be placed on the side proximal to reading circuit 13 and a distal memory cell 11B shown in FIG. 6 may be place on the distal side to reading circuit 13. By doing so, it may be possible to set the current drive performance of distal side memory cells 11B far from a reading circuit 13 higher than the current drive performance of proximal side memory cells 11A near the reading circuit 13. In this way, a difference in data propagation delay time Δt in a group of memory cells connected to the same bit line pair (BL and /BL) may be reduced. Thus, signal waveforms as illustrated in FIG. 7 may be obtained.

Figure 7:
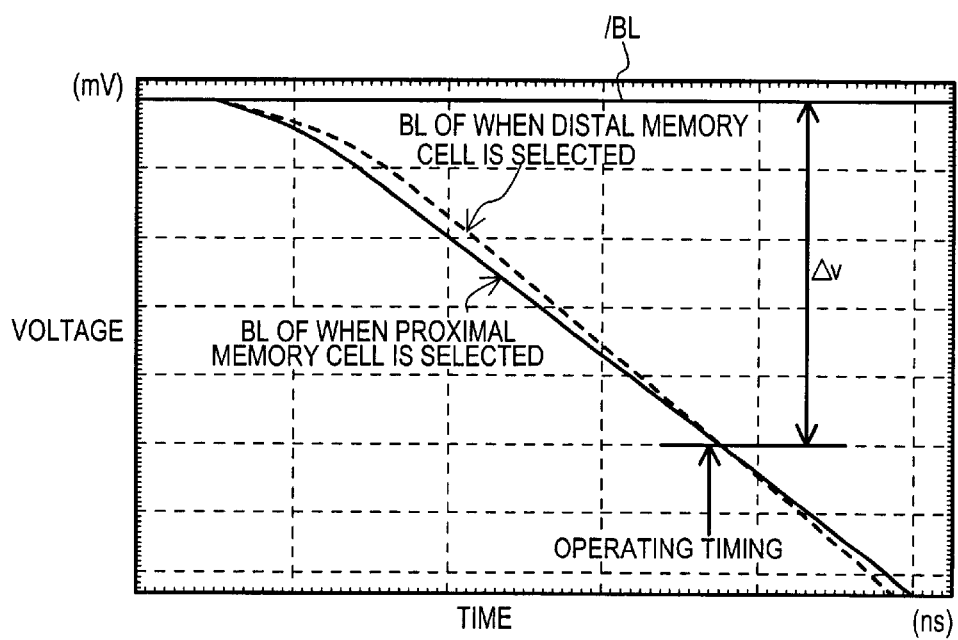
FIG. 7 a timing diagram illustrating the operating timing when a potential difference ΔV is provided on a bit line pair when memory cells are provided for proximal and distal memory cells in memory cell array region according to an embodiment.

Referring now to FIG. 7, a timing diagram illustrating the operating timing when a potential difference ΔV is provided on bit line pair (BL and /BL) when memory cells (11A and 11B) are provided for proximal and distal memory cells, respectively, in memory cell array region 30. As illustrated in FIG. 7, the signal waveform of bit line BL when a proximal memory cell 11A is selected may be identical to the signal waveform of bit line BL when a proximal memory cell is selected in FIG. 5. On the other hand, the signal waveform of bit line BL when a distal memory cell 11B is selected may be slanted more than the signal waveform of bit line BL when a distal memory cell is selected in FIG. 5. In this way according to FIG. 7, the signal waveform of bit line BL when distal memory cell 11B is selected and the signal waveform of bit line BL when proximal memory cell 11A is selected may reach the potential difference ΔV at essentially the same time. Accordingly, the operation speed of semiconductor memory device 100 as a whole may be improved by setting a difference in current drive performance between distal memory cell 11B and proximal memory cell 11A.

Referring once again to FIG. 6 in conjunction with FIG. 4, in distal memory cell 11B, gate widths of IGFETs may be set larger than in proximal memory cell 11A. In this way, the drive current performance may increase. Note that to keep data integrity, the drive current performance of n-type IGFETs (41a and 41b) and n-type IGFETs (43a and 43b) may be increased at essentially the same ratio.

A gate width WBa of n-type IGFETs (41a and 41b) and a gate width WBc of n-type IGFETs (43a and 43b) in distal memory cell 11B of FIG. 5 may have the following relationship with a gate width WAa of n-type IGFETs (41a and 41b) and a gate width WAc of n-type IGFETs (43a and 43b) in proximal memory cell 11A of FIG. 4.

$$WBa = WAa + \Delta WBa \quad (1)$$

$$WBc = WAc + \Delta WBC \quad (2)$$

WBa may be larger than WAa by ΔWBa and WBc may be larger than WAc by ΔWBC.

Compared to proximal memory cell 11A shown in FIG. 4, only portions of diffusion regions (46a, 47a, 46b, and 47b) that are related to gates thereof (a word line WL) are increased in distal memory cell 11B of FIG. 6 in accordance with an increase ΔWBa in gate width. Length Xb in a row direction X is made equal to length Xa in the row direction X of FIG. 4 to satisfy the following expression.

$$Xb = Xa \quad (3)$$

A length Yb in a column direction Y of distal memory cell 11B may be formed longer than the length Ya in the column direction Y of proximal memory cell 11A of FIG. 4 by an increase ΔWBc in gate width of n-type IGFETs (43a and 43b) to satisfy the following expression:

$$Yb = Ya + \Delta WBc \quad (4)$$

Figure 8:
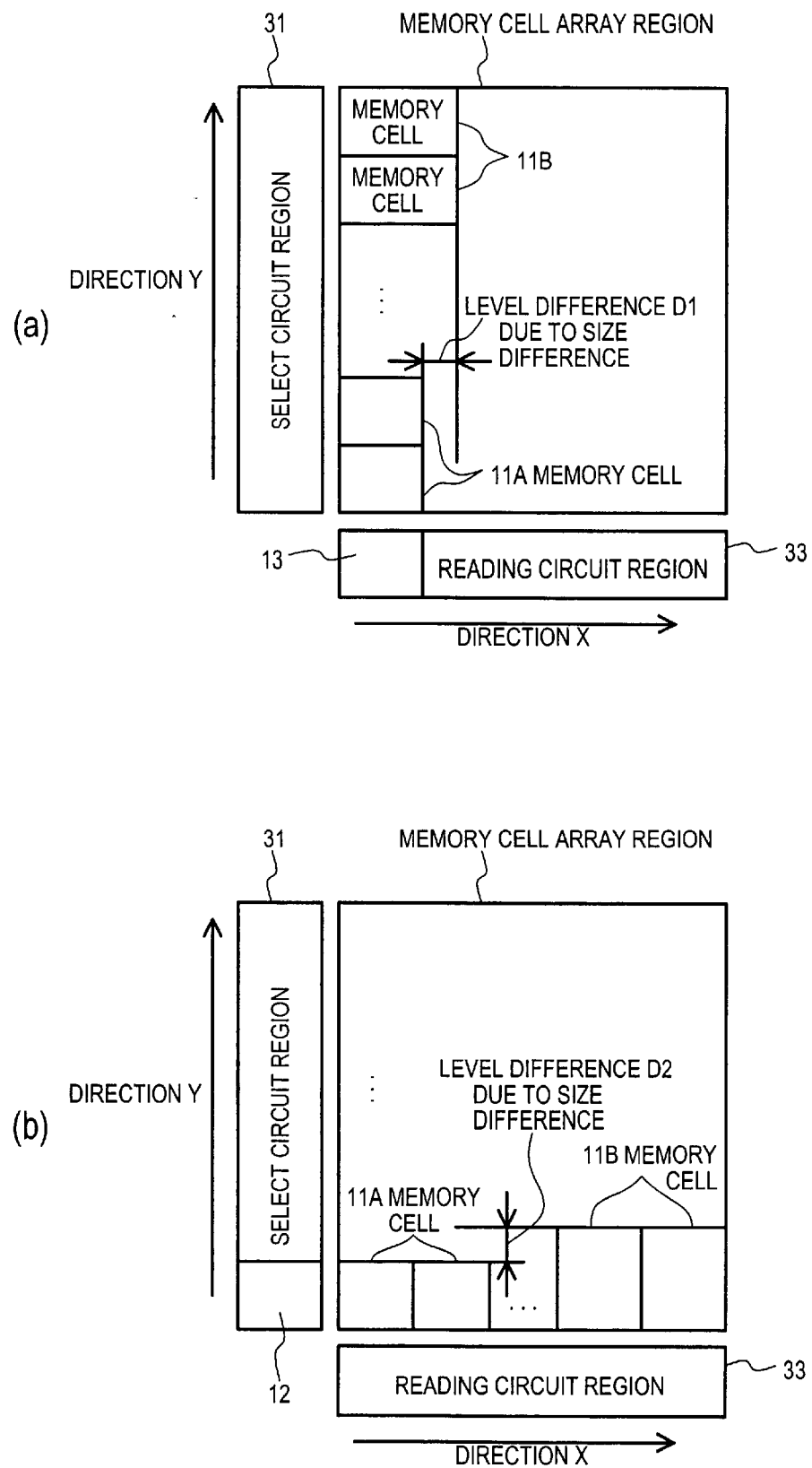
FIG. 8(a) is a plan view of a semiconductor memory device illustrating a level difference due to a mismatch of memory cell sizes in a row direction.
FIG. 8(b) is a plan view of a semiconductor memory device illustrating a level difference due to a mismatch of memory cell sizes in a column direction.

Only the length Yb in a column direction Y may be increased in distal memory cell 11B shown in FIG. 6. If the length Xb in a row direction X is increased when improving the current drive performance of distal memory cell 11B, the difference in size between distal memory cell 11B and proximal memory cell 11A may cause a level difference. Referring now to FIG. 8(a), a plan view of a semiconductor memory device illustrating a level difference due to a mismatch of memory cell sizes in a row direction is set forth. As shown in FIG. 8(a), if the length Xb in a row direction X is increased when improving the current drive performance of distal memory cell 11B, the difference in size between distal memory cell 11B and proximal memory cell 11A may cause a level difference D1 on the mask pattern. In this case, a mismatch may occur which may create problems such as a difficulty in connecting distal memory cell 11B to a reading circuit 13, as just one example. Accordingly, the length Yb in the column direction Y alone may be changed without changing the length Xb in the row direction X. In this way, the pitch mismatch between a reading circuit 13 and a distal memory cell 11B may be prevented. Thus, it may be possible to design a memory cell according to an embodiment using a conventional memory cell pitch.

When a length Yb in the column direction Y of a memory cell varies between a distal side and a proximal side to a reading circuit 13, a level difference in the column direction Y may occur. Referring now to FIG. 8(b), a plan view of a semiconductor memory device illustrating a level difference due to a mismatch of memory cell sizes in a column direction is set forth. As shown in FIG. 8(b), if the length Yb in a column direction Y is increased when improving the current drive performance of distal memory cell 11B, the difference in size between distal memory cell 11B and proximal memory cell 11A may cause a level difference D2 on the mask pattern. Level difference D2 may occur if memory cells 11 are manufactured with a minimum process and select circuit 12 has a pitch set to the minimum sized memory cell in the column direction Y.

However, in order to eliminate a pitch mismatch, the size and pitch of select circuit 12 on a side distal to reading circuit 13 may also be changed in accordance with distal memory cell 11B as shown in FIG. 6. In this way, it may be possible to eliminate a level difference D2 between a distal memory cell 11B and a select circuit 12 which may be caused by providing distal memory cells 11B having a length Yb in the column direction Y that may be longer than a length Ya of proximal memory cells 11A on the side proximal to reading circuit 13.

Figure 9:
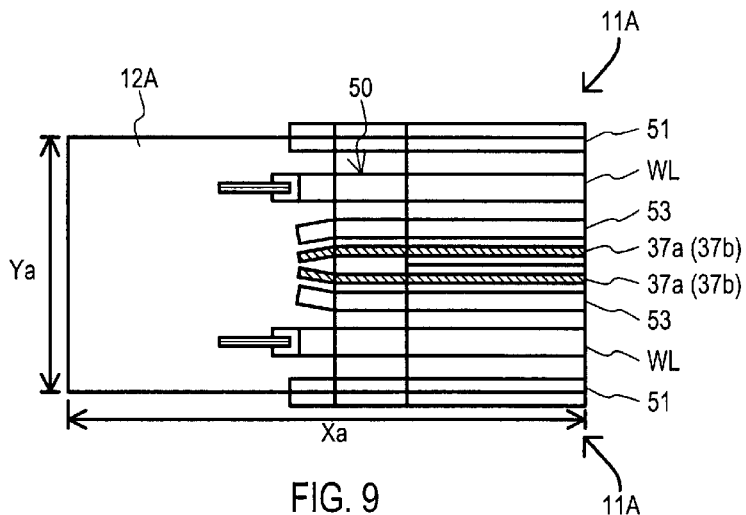
FIG. 9 is a plan view showing details of enlarged circle region P in FIG. 3 according to an embodiment.
Figure 10:
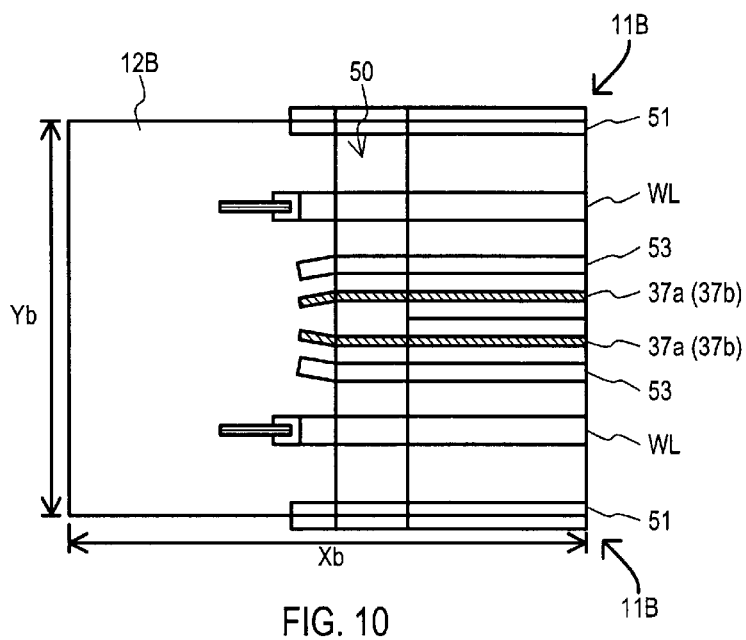
FIG. 10 is a plan view showing details of enlarged circle region Q in FIG. 3 according to an embodiment.

FIG. 9 is a plan view showing details of enlarged circle region P in FIG. 3 according to an embodiment. FIG. 9 shows a wire position when two proximal memory cells 11A on a side proximal to a reading circuit 13 are connected to one select circuit 12A. FIG. 10 is a plan view showing details of enlarged circle region Q in FIG. 3 according to an embodiment. FIG. 10 shows a wire position when two distal memory cells 11B on a side distal to a reading circuit 13 are connected to one select circuit 12B.

A length Yb in the column direction Y shown in FIG. 10 is longer than a length Ya in the column direction Y shown in FIG. 9. A distal select circuit 12B distal to a reading circuit 13 in FIG. 10 and a proximal select circuit 12A proximal to a reading circuit 13 in FIG. 9 may have similar functions (i.e. selection of a row of memory cells by providing a signal to a word line WL). In FIG. 9, a connection adjusting region 50 may be included for adjusting a connection between proximal memory cells 11A and a proximal select circuit 12A. In FIG. 10, a connection adjusting region 50 may be included for adjusting a connection between distal memory cells 11B and a distal select circuit 12B.

In FIG. 9, a word line WL and a gate polysilicon wire 37a (or 37b) that are also shown in FIG. 4 may also be present as well as aluminum wires (51 and 53) which are omitted from FIG. 4. Aluminum wires (51 and 53) may serve as a power supply electric potential line Vdd and a ground electric potential line Vss, respectively. This wiring structure may apply to FIG. 10 as well.

Figure 11:
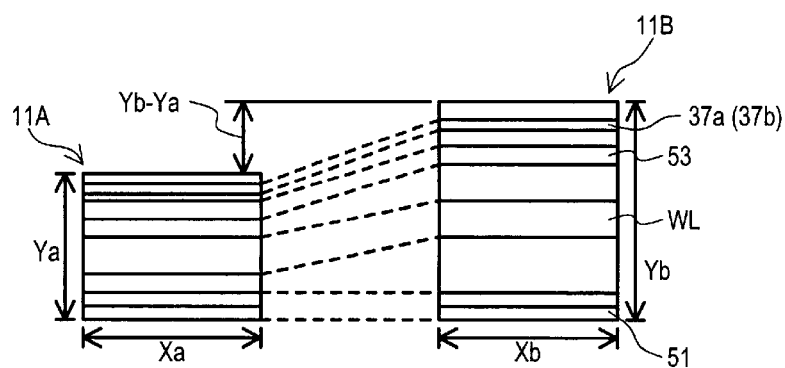
FIG. 11 is a plan view for comparing a proximal memory cell and a distal memory cell according to an embodiment.

Referring now to FIG. 11, a plan view for comparing a proximal memory cell 11A and a distal memory cell 11B according to an embodiment is set forth. As shown in FIG. 11, a length Yb in a column direction Y of distal memory cell 11B is longer than a length Ya in the column direction Y of proximal memory cell 11A by Yb−Ya. Therefore, spacing between wires WL, 37a (or 37b), 51, and 53 in distal memory cell 1B may be wider in order to compensate for the length difference.

Accordingly, connection adjusting region 50 may be given a function of connecting wires after adjusting the positions of wires WL, 37a (or 37b), 51, and 53 in a memory cell as determined by the memory cell size and are in a position that may be determined by the size (pitch) of a select circuit 12. By using a connection adjusting region 50, it may be possible to design internal structures of a proximal memory cell 11A, a distal memory cell 11B and a select circuit 12 separately in order to have optimum wire positions. Connection adjusting region 50 may be separated from and placed adjacent to select circuit 12 or may be included as a function in select circuit 12.

Figure 12:
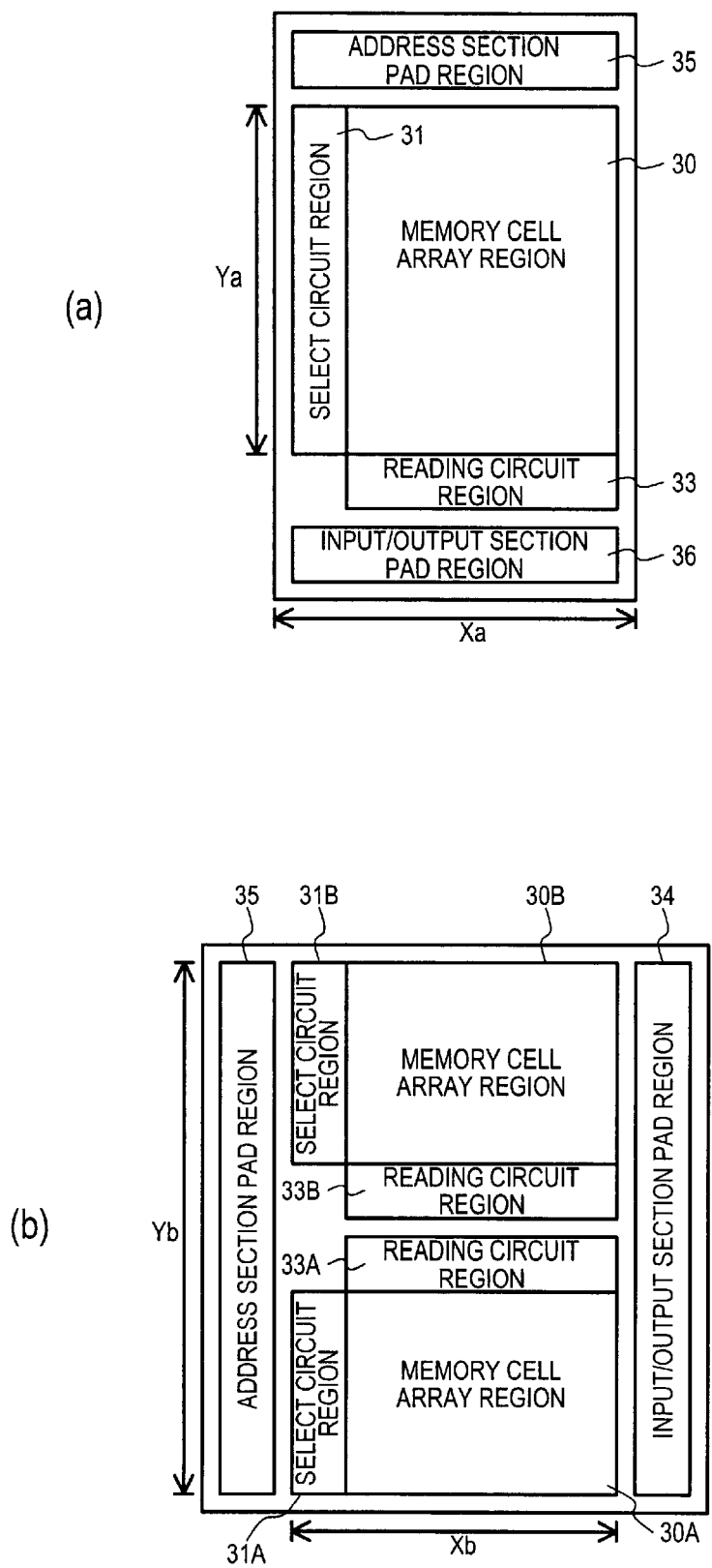
FIGS. 12(a) and 12(b) are plan views illustrating a bit line division that may occur in a semiconductor memory device according to an embodiment.

FIGS. 12(a) and 12(b) are plan views illustrating a bit line division that may occur in a semiconductor memory device according to an embodiment. FIG. 12(a) shows a structure in which 2n memory cells may be connected to one bit line. FIG. 12(b) shows a structure in which n memory cell may be connected to one bit line. FIGS. 12(a) and 12(b) may be semiconductor memory devices having the same memory capacity.

The semiconductor memory device shown in FIG. 12(a) may have an address section pad region 35, a select circuit region 31, a memory cell array region 30, a reading circuit region 33, and an input/output section pad region 36.

The semiconductor memory device shown in FIG. 12(b) may have a structure for improving the operation speed as compared to the semiconductor memory device of FIG. 12(a). Specifically, the semiconductor memory device of FIG. 12(b) may have memory cell array regions (30A and 30B) that may be obtained by dividing the number of memory cells in memory cell array region 30 in FIG. 12(a) in half. Each memory cell array region (30A or 30B) may be adjacent to a select circuit region (31A or 31B), respectively, that may be obtained by dividing the select circuit region 31 of FIG. 12(a) in half. Each memory cell array region (30A or 30B) may also be adjacent to a reading circuit region (33A or 33B), respectively, that may have essentially the same structure as reading circuit region 33 of FIG. 12(a).

The semiconductor memory device shown in FIG. 12(b) may thus require reading circuits 13 in a number matching the number of bit lines added by the division for obtaining the memory cell array regions (30A and 30B). The additional reading circuit region (30A or 30B may increase chip size. If the length of reading circuit region 33A (or 33B) in the row direction X and the length thereof in the column direction Y are set to 3730 μm and 113 μm, respectively, for example, the entire area of the reading circuit regions 33A and 33B may be 3730×113×2 μm².

Reasons that not all memory cells of the memory cell array region 30 are not subject to an improvement of current drive performance in the embodiment may include:

1) If all memory cells are increased in size by improving the current drive performance, the entire memory cell array region may be enlarged and chips size may increase.
2) The stand-by current may be raised and current consumption may increase.
3) Because the operation timing of a reading circuit may vary between a distal side memory cell and a proximal side memory cell, the proximal side memory cells may have to be designed specifically so that an operation timing of a reading circuit and the like may be delayed and the memory cell location dependency with respect to a peripheral control circuit may not be optimized.

Figure 13:
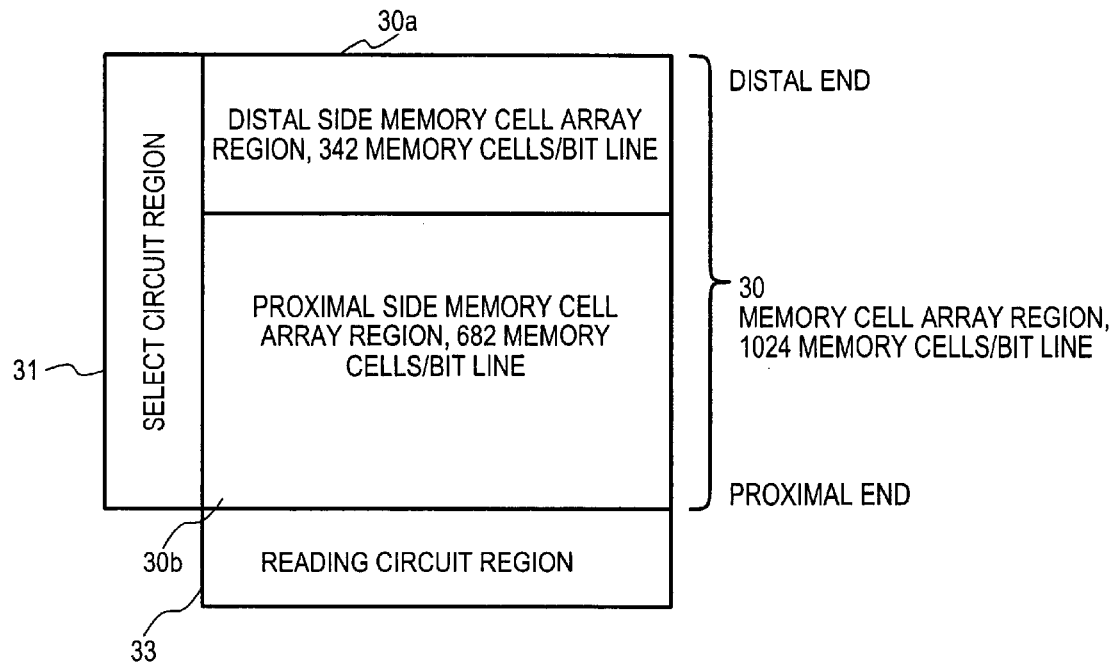
FIG. 13 is a block schematic diagram showing the structure of a memory cell array according to an embodiment.

Referring now to FIG. 13, a block schematic diagram showing the structure of a memory cell array according to an embodiment is set forth.

In the structural example of FIG. 13, 1024 memory cells may be connected to one bit line for each bit line throughout memory cell array region 30. Memory cell array region 30 may be divided into a distal memory cell array region 30a having 342 (about ⅓) of the memory cells connected to a word line and a proximal memory cell array region 30b having 682 (about ⅔) of the memory cells connected to a word line. Proximal memory cell array region 30b may only include memory cells that may be designed according to a minimum size with respect to a process. Distal memory cell array region 30b may include memory cells having an increased drive strength with respect to memory cells in proximal memory cell array region 30b. Proximal side memory cell array region 30b may be closer to a reading circuit region 33 than distal side memory cell array region 30a.

By providing a proximal side memory cell array region 30b and a distal side memory cell array region, the operation timing T of a reading circuit 13 may be provided earlier.

The operation speed of the semiconductor memory device may be improved by increasing gate widths of n-type IGFETs (41a, 41b, 43a, and 43b) for memory cells 11 (FIG. 2) of an SRAM for the memory cells 11 in distal side memory array region 30a. In this case, as described above, a length Xb in a row direction X of a distal memory cell 11B (FIG. 6) may be equal to a length Xa in a row direction X of a proximal memory cell 11A (FIG. 4). However, a length Yb in a column direction Y of a distal memory cell 11B (FIG. 6) may be longer than a length Ya in a column direction Y of a proximal memory cell 11A (FIG. 4).

A size increase by including distal memory cells according to an embodiment versus a size increase by dividing a bit line in half as in a conventional approach will now be discussed. If a length (113 μm) by providing an extra reading circuit region 33A (or 33B) of FIG. 12(b) in a column direction Y is divided equally into 342 (the number of distal side memory cells 11B in a column direction in the semiconductor memory device of FIG. 13), the length per memory cell is about 0.33 μm. Accordingly if an increased width ΔW of a distal memory cell 11B is greater than 0.33 μm, the area increase in a semiconductor memory device of FIG. 13 may be greater than an increase in area when the conventional bit line division approach is employed. Therefore, it is desirable in the structural example illustrated in FIG. 13 that the maximum increase of a length Yb in a column direction per distal memory cell 11B of FIG. 6 is 0.33 μm of or less.

Figure 14:
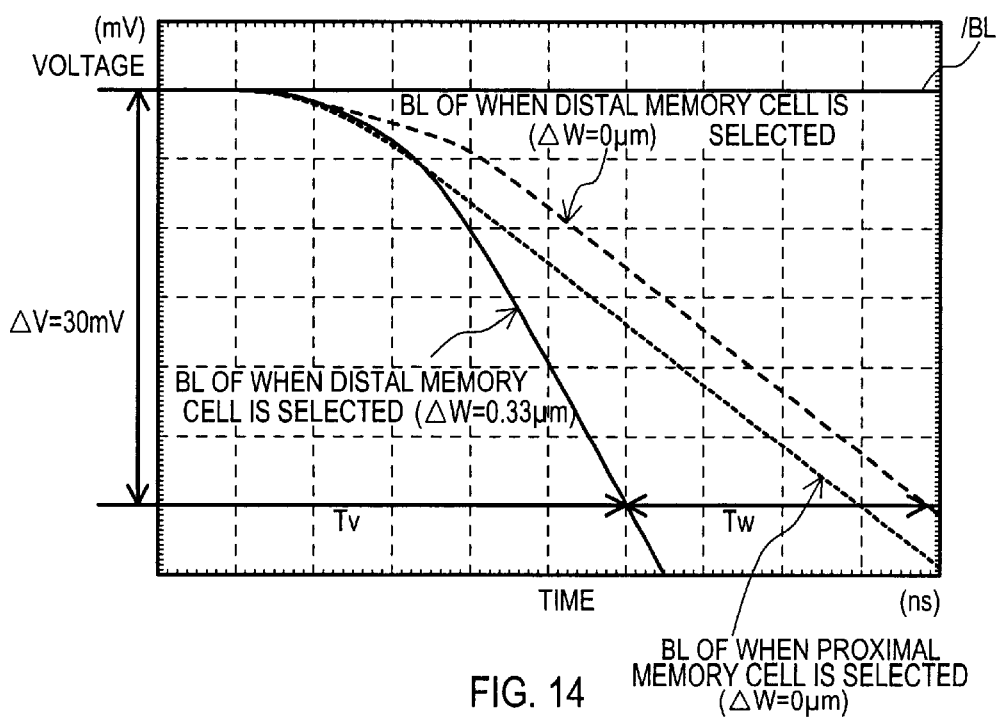
FIG. 14 is a graph showing the signal waveform of bit lines when selecting a distal memory cell having an increased drive strength as compared to a conventional approach.

FIG. 14 is a graph showing the signal waveform of bit lines when selecting a distal memory cell having an increased drive strength as compared to a conventional approach. The graph of FIG. 14 shows the bit line voltages (dashed lines) when a distal memory cell is selected or a proximal memory cell is selected in a conventional approach with memory cells designed in accordance with minimal process capabilities. The solid line is a bit line voltage when a distal memory cell 11B according to an embodiment is selected in which an increased width ΔW in a column direction Y is 0.33 μm as compared to a proximal memory cell 11A. This may be accomplished by increasing gate widths of n-type IGFETs (41a, 41b, 43a, and 43b) illustrated in FIG. 2 by 0.33 μm.

As illustrated in FIG. 14, when dimensions of a distal memory cell 11B are increased to a maximum allowable to keep the same chip size as an approach in which bit lines are divided by 2 (FIG. 12(b)), the data propagation time of data from a distal memory cell 11B is decreased by a time Tw. The timing Tw is greater than a timing difference between a distal memory cell access and a proximal memory cell access in the conventional approach. Thus, it can be seen that chip area may be decreased in the approach according to an embodiment as compared to a conventional approach when a distal memory cell 11B is designed with dimensions that allow an access time for a distal memory cell 11B to match an access time for a proximal memory cell 11A as the increase in distal memory cell 11B compared to a conventional memory cell 11 may be less than 0.33 μm.

The graph of FIG. 14 shows that the semiconductor memory device operation speed may be improved while reducing an area increase as compared to a conventional approach using bit line division. This may be accomplished by controlling the current drive performance of distal memory cell 11B to provide a reduced access time less than a time Tw (a maximum reduced time where a bit line differential reaches 30 mV without increasing chip size), so that an access time for a distal memory cell 11B may essentially match an access time of a proximal memory cell 11A. In this way, an overall access time may be improved with a reduced increase in chip size as compared to a conventional approach.

A memory cell region may include memory cells having an increased current drive. In this way, an operation timing may be improved. In accordance with the desired results, a memory device may be configured according to the following cases:

Case (1)—A memory cell array region 30 may be divided into multiple regions. Each of the multiple regions may include memory cells having a drive strength in accordance with a distal proximity with respect to a reading circuit region 33. In this way, the current drive performance of memory cells in each region may be improved toward the distal side.

Case (2)—The current drive performance of a memory cell array region 30 on a side distal to a specific reading circuit 13 may be improved and the operation timing T of the reading circuit region 33 may be set according to a worst case memory cell.

Case (3)—The performance of each memory cell 11 may be improved so that the electric potential difference of a bit line pair may reach ΔV at a desired operation timing T regardless as to the location of a selected memory cell 11.

A memory device may employ different configurations than the above-mentioned cases (1)–(3).

In the above cases (1)–(3), a select circuit 12 may be designed to have a pitch and size essentially matched to those of a memory cell 11 connected thereto (in the same row).

Figure 15:
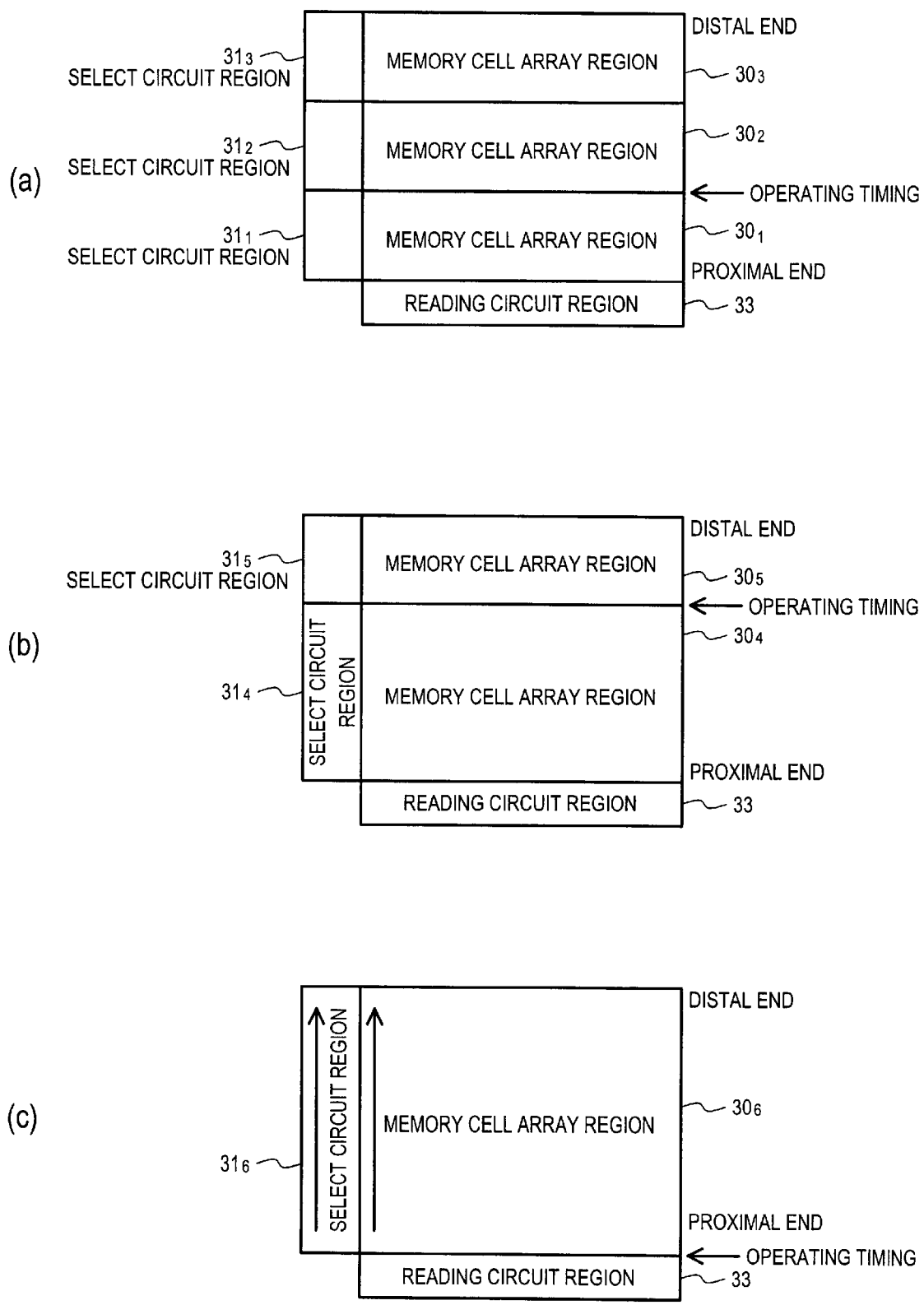
FIGS. 15(a)–(c) are schematic diagrams illustrating a memory cell array regions in which a memory cell performance is controlled according to embodiments.

FIGS. 15(a)–(c) are schematic diagrams illustrating a memory cell array regions in which a memory cell performance is controlled according to embodiments. FIG. 15(a) is a schematic diagram showing an example of the above-mentioned case (1) according to an embodiment. FIG. 15(b) is a schematic diagram showing an example of the above-mentioned case (2) according to an embodiment. FIG. 15(c) is a schematic diagram showing an example of the above-mentioned case (3) according to an embodiment.

Referring now to FIG. 15(a), memory cell array regions ($30_1$ to $30_3$) may be connected to a reading circuit region 33. Memory cell array regions ($30_1$ to $30_3$) may be arranged so that memory cell array region $30_1$ may be nearest a proximal end with respect to reading circuit region 33. Memory cell array region $30_3$ may be nearest a distal end with respect to reading circuit region 33. Memory cell array region $30_2$ may be between memory cell array regions ($30_1$ and $30_3$). Select circuit regions ($31_1$ to $31_3$) may be connected to memory cell array regions ($30_1$ to $30_3$), respectively. Each memory cell array region ($30_1$ to $30_3$) may include memory cells having a drive strength such that memory cell array region $30_1$ may have memory cells with a weaker drive strength and memory cell array region $30_3$ may have memory cells with a stronger drive strength. Memory cell array region $30_2$ may have memory cells with an intermediate drive strength.

Referring now to FIG. 15(b), memory cell array regions ($30_4$ and $30_5$) may be connected to a reading circuit region 33. Memory cell array regions ($30_4$ and $30_5$) may be arranged so that memory cell array region $30_4$ may be nearest a proximal end with respect to reading circuit region 33. Memory cell array region $30_5$ may be nearest a distal end with respect to reading circuit region 33. Select circuit regions ($31_4$ and $31_5$) may be connected to memory cell array regions ($30_4$ and $30_5$), respectively. Each memory cell array region ($31_4$ and $31_5$) may include memory cells having a drive strength such that memory cell array region $30_4$ may have memory cells with a weaker drive strength and memory cell array region $30_5$ may have memory cells with a stronger drive strength.

Referring now to FIG. 15(c), memory cell array region $30_6$ may be connected to a reading circuit region 33. Memory cell array region $30_6$ may have memory cells having an adjusted drive strength with respect to a proximity to a reading circuit region 33 so that a electric potential difference of a bit line pair may reach ΔV at a desired operation timing T regardless as to the location of a selected memory cell. Select circuit region $31_6$ may be connected to memory cell array region $30_6$. Select circuit region $31_6$ may include select circuits having an adjusted pitch to essentially match the pitch of memory cells connected thereto (in the same row).

Figure 16:
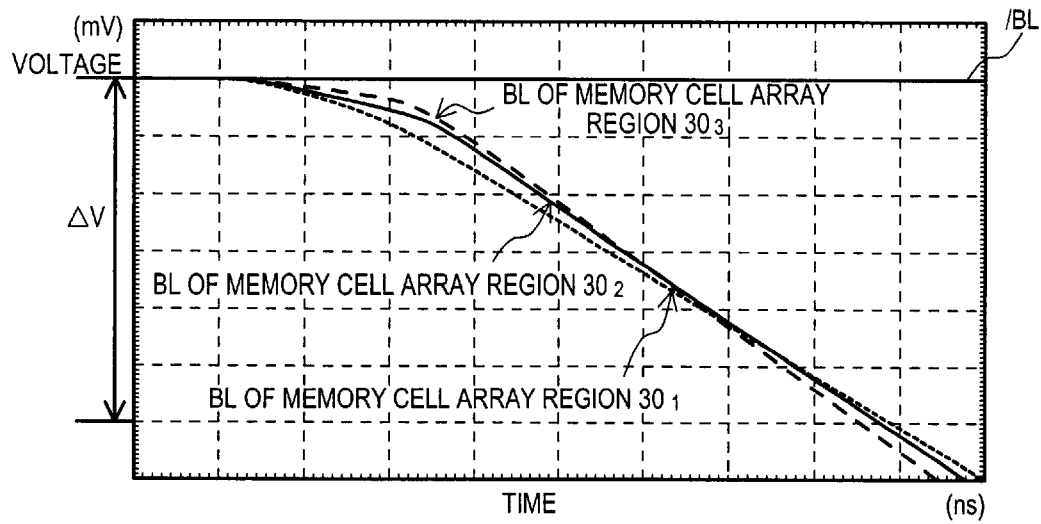
FIG. 16 is a graph showing the signal waveform of bit lines when a memory cell is selected from memory cell array regions as illustrated in FIG. 15(a) according to an embodiment.

Referring now to FIG. 16, is a graph showing the signal waveform of bit lines when a memory cell is selected from memory cell array regions as illustrated in FIG. 15(a) according to an embodiment. As shown in FIG. 16, electric potential difference of a bit line pair may reach ΔV at essentially the same time regardless as to which memory cell array region ($30_1$ to $30_3$) the selected memory cell is located.

When a semiconductor memory device is designed, the optimal one of above-mentioned cases (1)–(3) may be selected by taking into consideration the manufacturing process employed, the memory cell structure, circuit characteristics, product specification, and the like.

Another embodiment of the present invention will now be described. Similar to previous embodiments, this embodiment may be a SRAM as set forth in FIG. 1 using a memory cell as set forth in FIG. 2. This embodiment may reduce a propagation time difference between a distal memory cell and a proximal memory cell which may be caused by parasitic resistance and/or capacitance of a word line WL when a distal memory cell 11B far from a select circuit 12 is selected.

Figure 17:
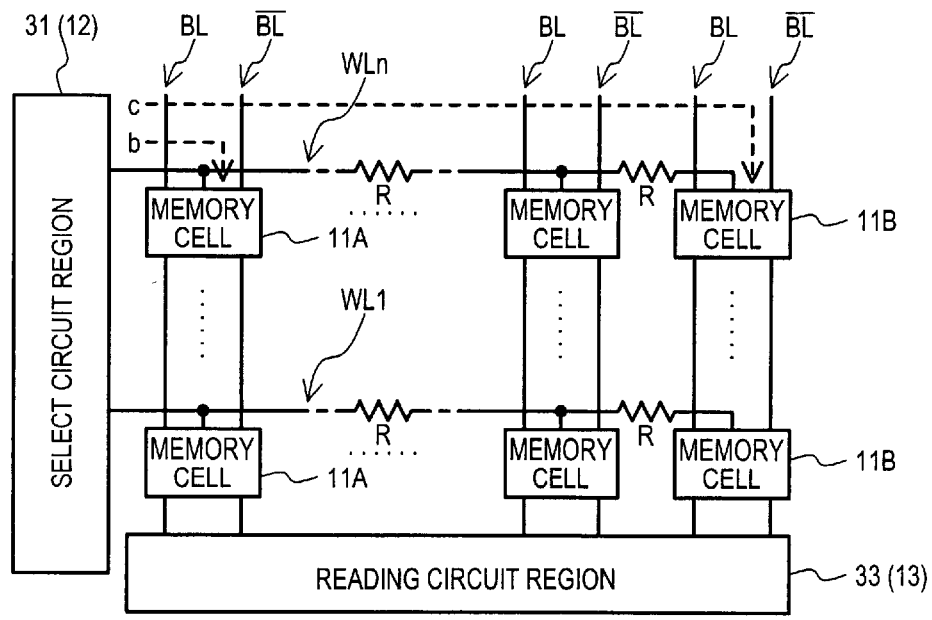
FIG. 17 is a block schematic diagram of a semiconductor memory device illustrating current paths for selecting a proximal memory cell and a distal memory cell with respect to a select circuit region according to an embodiment.

Referring now to FIG. 17, a block schematic diagram of a semiconductor memory device illustrating current paths for selecting a proximal memory cell 11A and a distal memory cell 11B with respect to a select circuit region 31 is set forth. A current path b may be a current path when a proximal memory cell 11A is selected. A current path c may be a current path when a distal memory cell 11B is selected. A select circuit region 31 may include a plurality of select circuits 12 and a reading circuit region 33 may include a plurality of reading circuits 13 arranged in essentially the same manner as illustrated in FIG. 30. Thus, m memory cells may be connected to a select circuit 12 in a row direction and n memory cells may be connected to a reading circuit 13 in a column direction. FIG. 17 illustrates the parasitic resistance R of a word line WL.

In the embodiment of FIG. 17, in a group of memory cells connected to the same word line WL, the current drive of a distal memory cell 11B on a distal side to select circuit region 31 may be higher than the current drive of a proximal memory cell 11A on a proximal side to select circuit region 31. In this way, an electric potential difference of a bit line pair (BL and /BL) as desired may be provided at similar timings regardless as to whether a proximal memory cell 11A or a distal memory cell 11B is selected. Thus, a difference in reading speed between distal side memory cells 11B and proximal side memory cells 11A may be reduced. In order to improve the current drive performance of distal side memory cells 11B, gate widths of n-type IGFETs (41a and 41b) and n-type IGFETs (43a and 43b) of FIG. 2 may be increased. In order to maintain data integrity, current drive ratios may be maintained.

Figure 18:
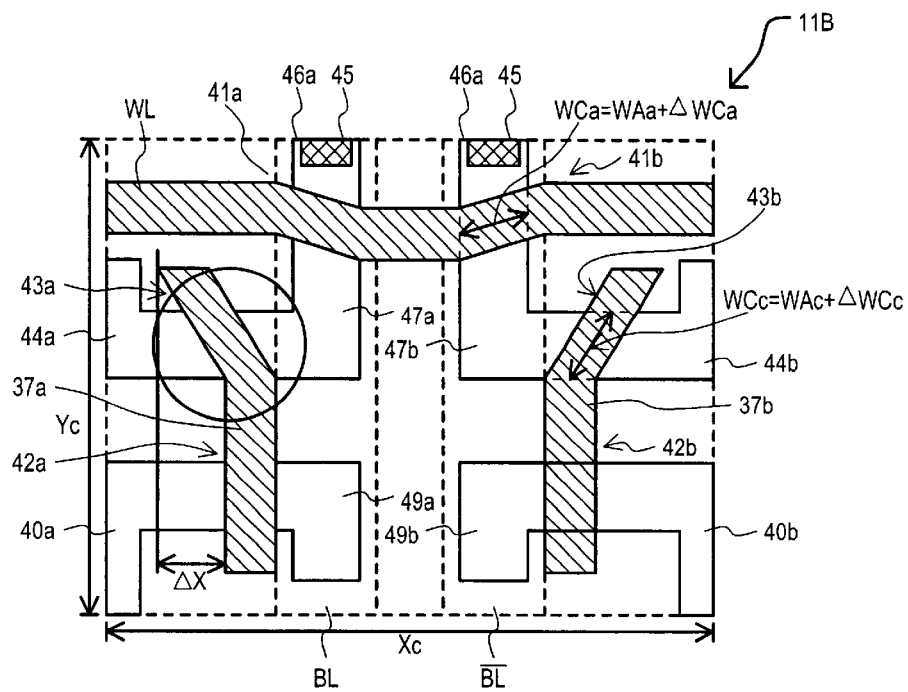
FIG. 18 is a plan view of mask pattern images of portions distal memory cells 11B of FIG. 17.

Referring now to FIG. 18, a plan view of mask pattern images of portions distal memory cells 11B of FIG. 17. The mask pattern of FIG. 18 may correspond to a circuit diagram of a memory cell as illustrated in FIG. 2. FIG. 18 may include similar constituents as FIGS. 4 and 6. Such constituents may be referred to by the same reference character.

Gate widths (WCa and WCc) of n-type IGFETs (41a and 41b) and n-type IGFETs (43a and 43b) may have the following relationship with gate widths of n-type IGFETs (41a and 41b) and n-type IGFETs (43a and 43b) (proximal memory cells).

$$WCa = WAa + \Delta WCa \quad (6)$$

$$WCc = WAc + \Delta WCc \quad (7)$$

As expressions (6) and (7) show, gate widths (WCa and WCc) of n-type IGFETs (41a and 41b) and n-type IGFETs (43a and 43b) for distal memory cell 11B of FIG. 18 may be larger than corresponding gate widths for proximal memory cell 11A of FIG. 4 by $\Delta WCa$ and $\Delta WCc$, respectively.

Unlike distal memory cell 11B of FIG. 6, distal memory cell 11B may obtain gate widths larger than those of proximal memory cell of FIG. 4 by making gate electrodes over channel regions of n-type IGFETs (41a and 41b) connected to a word line WL and gate polysilicon wires (37a and 37b) over channel regions of n-type IGFETs (43a and 43b) slanted (not perpendicular to the diffusion region) while maintaining process design rules. Accordingly, a length Yc in a column direction Y of distal memory cell 11B may not be longer than that of proximal memory cell 11A.

$$Yc = Ya \quad (8)$$

Distal memory cell 11B according to the embodiment of FIGS. 17 and 18 may be formed by modifying a mask pattern of proximal memory cell 11A illustrated in FIG. 4 to make a length in a column direction Y constant while increasing gate widths of n-type IGFETs (41a and 41b) and n-type IGFETs (43a and 43b) each by $\Delta W$. In distal memory cell 11B of FIG. 18, n-type IGFETs (41a and 41b) and n-type IGFETs (43a and 43b) may include gate electrodes that may be slanted at essentially the same angle.

Figure 19:
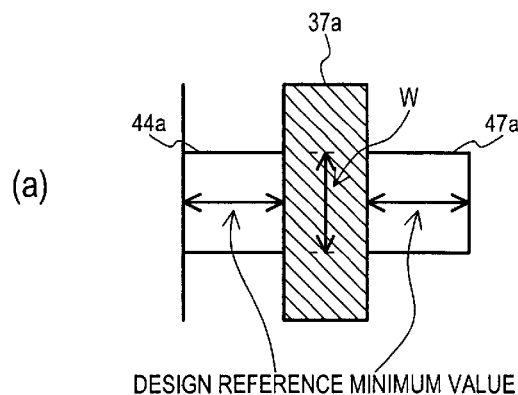
FIGS. 19(a) and 19(b) are plan views of mask pattern images illustrating a method of increasing a gate width of an IGFET according to an embodiment.
Figure 19:
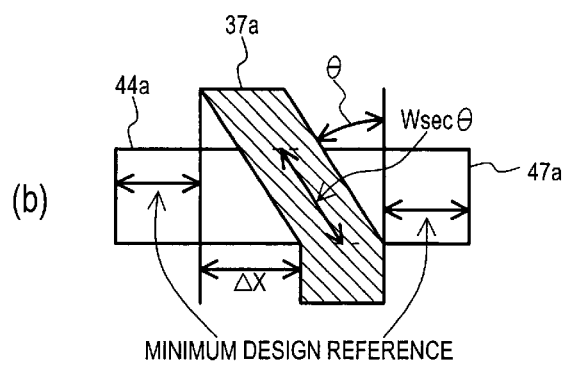

FIGS. 19(a) and 19(b) are plan views of mask pattern images illustrating a method of increasing a gate width of an IGFET according to an embodiment.

In the embodiment of FIG. 6, a gate width of polysilicon wire 37a (or 37b) may be increased by making a diffusion region wider. In this embodiment as illustrated in FIGS. 19(a) and 19(b), a gate width W may be increased by slanting a polysilicon wire 37a (or 37b) at an angle θ (hereinafter referred to as angle of inclination θ). In order to maintain process minimum design rules, a diffusion layers (44a and 47a) may be lengthened by $\Delta X$.

When increasing the angle of inclination θ, the diffusion layers (44a and 47a) may be increased by $\Delta X$ in order to keep a proper gate to adjacent gate distance to meet the process minimum design rules (design reference minimum value). The length Xc in the row direction X shown in FIG. 18 may satisfy the following expression with respect to a length Xa in the row direction shown in FIG. 4.

$$Xc = Xa + 2\Delta X \quad (9)$$

If the length Yc in the column direction Y is increased to improve the current drive performance of a distal memory cell 11B on the distal side to the select circuit 12, a level difference D2 (a pitch mismatch) illustrated in FIG. 8(b) may be created in the layout (mask) due to the differences in size between distal memory cells 11B and proximal memory cells 11A with respect to select circuit 12. The embodiment illustrated in FIGS. 17 and 18, may avoid problems that may be created due to level difference D2. Such problems may include an interconnection mismatch between adjacent memory cells 11 caused by increasing a length Xc in a row direction X.

If a length Xc in the row direction X of a memory cell 11 varies between the distal side and the proximal side with respect to a select circuit 12, a level difference D2 may be formed between a memory cell 11 manufactured with minimum process design rules and reading circuits 13 arranged at the same pitch as the minimum sized memory cell 11. Therefore, the size and pitch of reading circuits 13 on the side distal to select circuit region 31 may also change in accordance with distal memory cell 11B shown in FIG. 18. In this way, it may be possible to eliminate a level difference (pitch difference) between a column of memory cells and a reading circuit 13 which may be caused by increasing a length Xe in the row direction X to be longer in a distal side memory cell 11B than a length Xa in the row direction X in a proximal side memory cell 11A.

Figure 20:
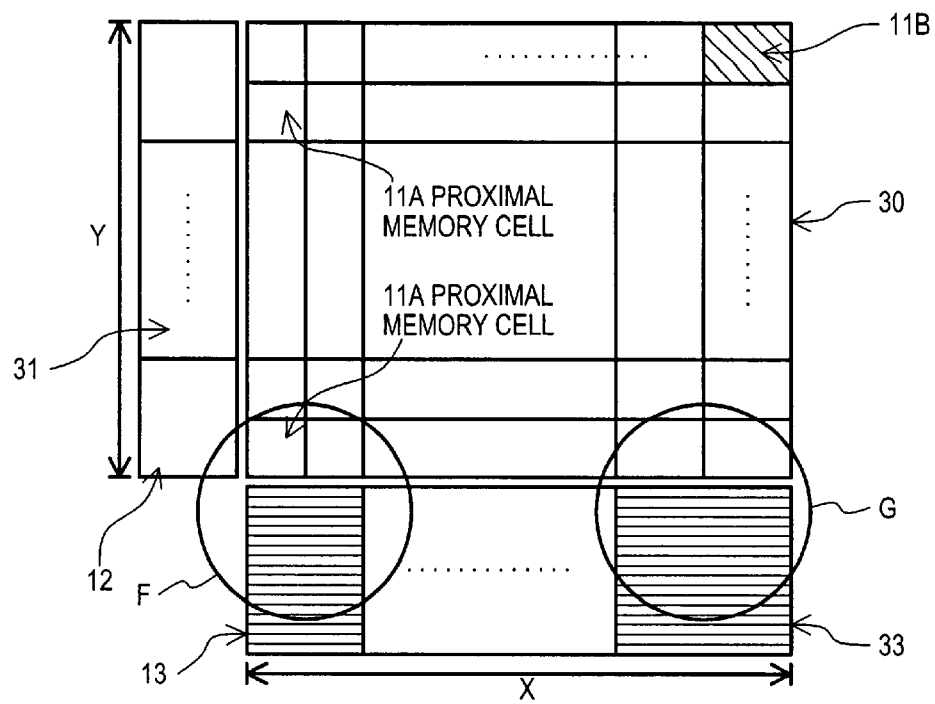
FIG. 20 is a plan view illustrating a mask image of a portion semiconductor memory device according to an embodiment.

Referring now to FIG. 20, a plan view illustrating a mask image of a portion semiconductor memory device according to an embodiment is set forth. The semiconductor memory device of FIG. 20 may correspond to the semiconductor memory device of FIG. 17 including the distal memory cell 11B structure of FIG. 18. The semiconductor memory device of FIG. 20 may include a memory cell array region 30, a select circuit region 31, and a reading circuit region 33 similar to FIG. 3. However, proximal side memory cells in FIG. 20 may refer to memory cells proximal to a select circuit region 31 and distal side memory cells in FIG. 20 may refer to memory cells distal to select circuit region 31.

Figure 21:
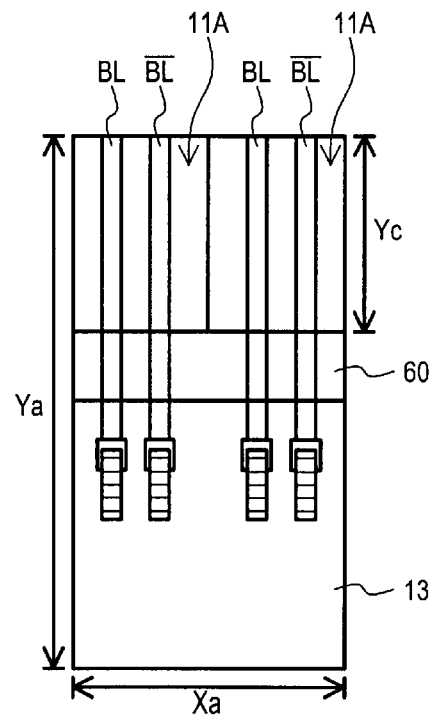
FIG. 21 is a plan view showing details of enlarged circle region F in FIG. 20 according to an embodiment.
Figure 22:
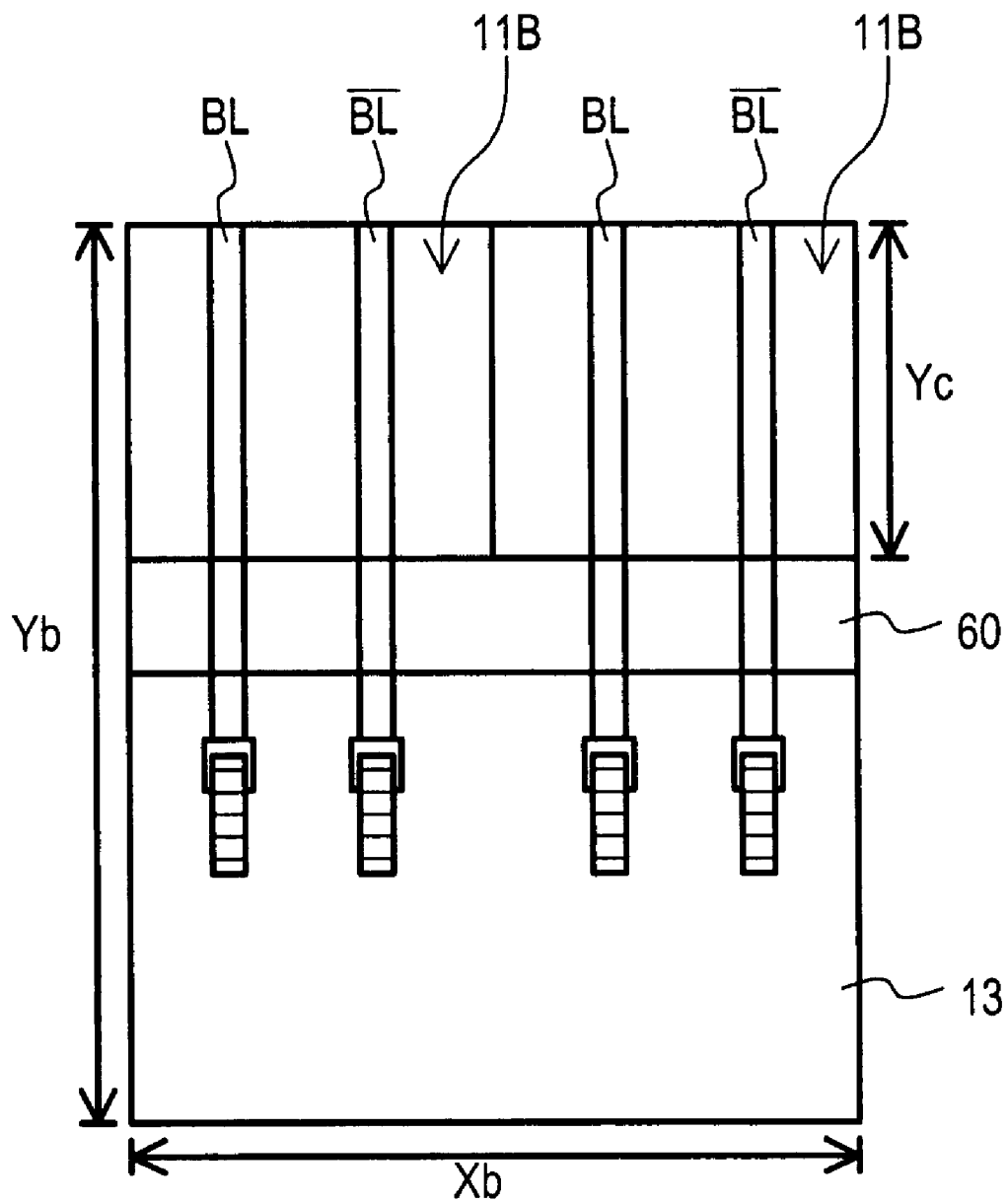
FIG. 22 is a plan view showing details of enlarged circle region G in FIG. 20 according to an embodiment.

FIG. 21 is a plan view showing details of enlarged circle region F in FIG. 20 according to an embodiment. FIG. 20 shows a wire position when two proximal memory cells 11A on a side proximal to a select circuit 12 are connected to one reading circuit 13. FIG. 22 is a plan view showing details of enlarged circle region G in FIG. 20 according to an embodiment. FIG. 22 shows a wire position when two distal memory cells 11B on a side distal to a select circuit 12 are connected to one reading circuit 13.

As shown in FIGS. 21 and 22, the length Ya in the column direction Y of FIG. 21 of proximal memory cell 11A may be equal to the length Yb in the column direction of distal memory cell 11B. However, the length Xb in the row direction X of FIG. 21 of distal memory cell 11B may be greater than the length Xa in the row direction of proximal memory cell 11A.

Wires in a reading circuit 13 on a side distal and on a side proximal to a select circuit region 31 may be positioned to ensure an optimal connection to bit lines (BL and /BL) positioned in associated distal and proximal memory cells (11A and 11B). Because the size and positions of a wire of a reading circuit 13 may vary between a distal side and a proximal side with respect to a select circuit 12, a connection adjusting region 60 may be provided between a memory cell (11A or 11B) and reading circuit 13.

Connection adjusting region 60 may provide a connection between bit lines (BL and /BL) and wires in reading circuit 13 by providing a positional adjustment to bit lines (BL and /BL) in accordance with the size of a reading circuit 13. By using a connection adjusting region 60, it may be possible to design internal structures of a proximal memory cell 11A, a distal memory cell 11B and a reading circuit 13 separately in order to have optimum wire positions. Connection adjusting region 60 may be separated from and placed adjacent to reading circuit 13 or may be included in reading circuit 13.

The current drive performance of a distal memory cell 11B (distal with respect to a select circuit region 31) may be enhanced so a state where an electric potential difference between a bit line pair (BL and /BL) necessary for proper operation of a reading circuit 13 may be obtained when the distal memory cell 11B is selected. Therefore, a data propagation time to a reading circuit 13 may be shortened. In this way, it may be possible to reduce a difference in data propagation time caused by a difference in distance between a selected memory cell 11 and a select circuit 12.

Figure 23:
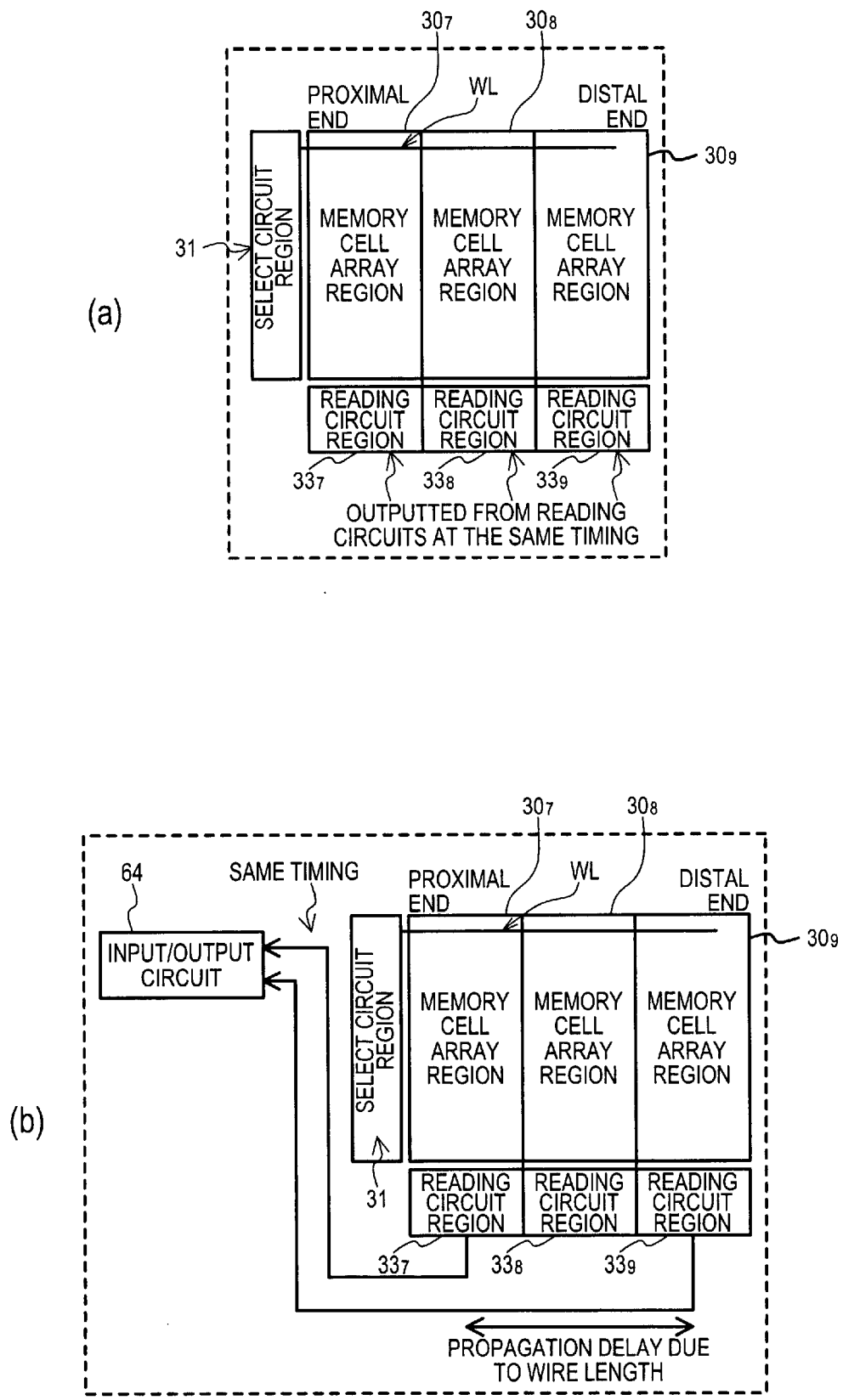
FIG. 23(a) is a memory device including memory cell array regions including memory cells having an increased drive strength in accordance with a distance between the memory cell array region and a select circuit region according to an embodiment.
FIG. 23(b) is a semiconductor memory device including memory cell array regions including memory cells having an increased drive strength in accordance with a distance between the memory cell array region and a select circuit region according to an embodiment.

Conceivable configurations of a memory cell performance control region may include examples as illustrated below which may improve yield and/or make a timing conform to a desired specification and/or improve operation of a memory device. For example, FIG. 23($a$) sets forth a memory device including memory cell array regions ($30_7$ to $30_9$) including memory cells having an increased drive strength in accordance with a distance between the memory cell array region ($30_7$ to $30_9$) and a select circuit region 31. In FIG. 23($a$), each memory cell array region ($30_7$ to $30_9$) may be connected to a reading circuit region ($33_7$ to $33_9$), respectively. Current drive performance of memory cell array regions ($30_7$ to $30_9$) may be improved toward a side distal to select circuit region 31. Memory cell array region $30_9$ may include memory cells having a stronger drive strength than memory cell array region $30_8$. Memory cell array region $30_8$ may include memory cells having a stronger drive strength than memory cell array region $30_7$. The current drive of memory cells may be improved to compensate for delay time differences due to word line resistance. According to the embodiment of FIG. 23($a$), the timing of data outputs from memory cell array regions ($30_7$ to $30_9$) to respective reading circuit regions ($33_7$ to $33_9$) may be essentially the same regardless as to the location of a memory cell 11 selected by a select signal. In FIG. 23($a$), reading circuits 13 in reading circuit regions ($33_7$ to $33_9$) may be designed in accordance with a pitch of the column or columns of memory cells 11 to be connected thereto.

FIG. 23($b$) illustrates a semiconductor memory device including memory cell array regions ($30_7$ to $30_9$) including memory cells having an increased drive strength in accordance with a distance between the memory cell array region ($30_7$ to $30_9$) and a select circuit region 31. Each memory cell array region ($30_7$ to $30_9$) may be connected to a reading circuit region ($33_7$ to $33_9$), respectively. In FIG. 23($b$) an input/output circuit 64 may be included. Input/output circuit 64 may receive data from reading circuit regions ($33_7$ to $33_9$). Each reading circuit region ($33_7$ to $33_9$) may have a different distance from input/output circuit 64. Thus, a data propagation delay for data from each reading circuit region ($33_7$ to $33_9$) may be different due to differing wire routing lengths. In the embodiment of FIG. 23($b$), the current drive of memory cells may be improved to compensate for delay time differences due to word line resistance and wiring resistance between reading circuit regions ($33_7$ to $33_9$) and an input/output circuit 64. In this way, a final timing of data provided to input/output circuit 64 may be essentially the same regardless as to the location of a memory cell 11 selected by a select signal and/or location of a reading circuit 13 providing the data. Also, in the embodiment of FIG. 23($b$), reading circuits 13 in reading circuit regions ($33_7$ to $33_9$) may be designed in accordance with a pitch of the column or columns of memory cells 11 to be connected thereto.

Figure 24:
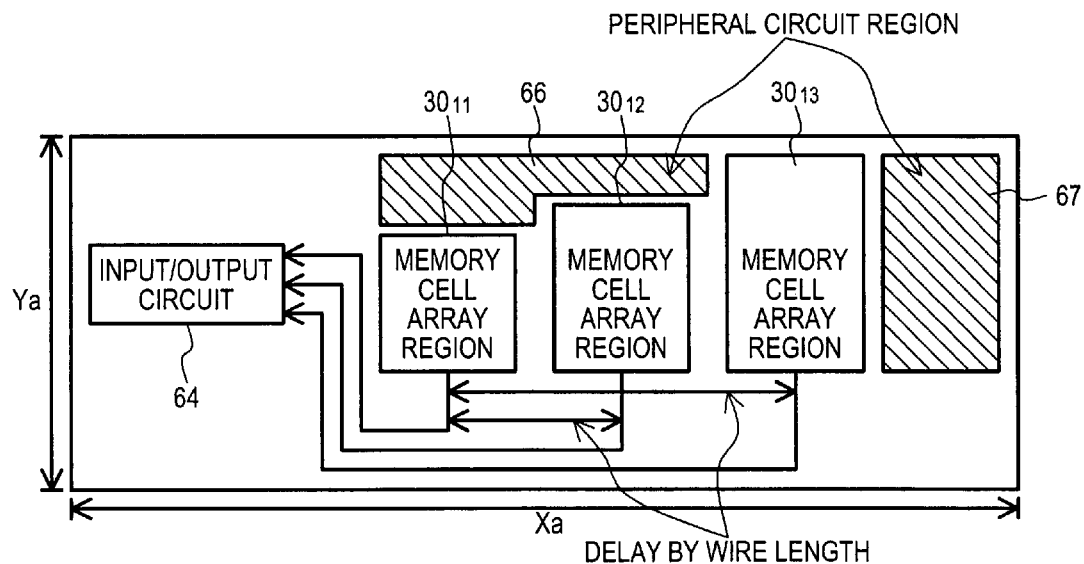
FIG. 24 is a plan view of a semiconductor memory device composed of a very large integrated circuit according to an embodiment.

FIG. 24 is a plan view of a semiconductor memory device composed of a very large integrated circuit according to an embodiment. The semiconductor memory device of FIG. 24 includes memory cell array regions ($30_{11}$ to $30_{13}$) in which the current drive of memory cells 11 in memory cell array region ($30_{12}$ and $30_{13}$) may be increased by increasing a size of memory cells 11 in a column direction Y. In FIG. 24, the length of a data carrying wire to an input/output circuit 64 from memory cell array regions ($30_{11}$ to $30_{13}$) at a worst case may be shortened compared to a case in which current drive of memory cells 11 are increased by increasing a size of memory cells 11 in a column direction Y (for example, FIG. 25). However, in the example of FIG. 24, for efficient use of chip area, the arrangement of peripheral circuits (66 and 67) may be such that interconnections may be problematic.

Figure 25:
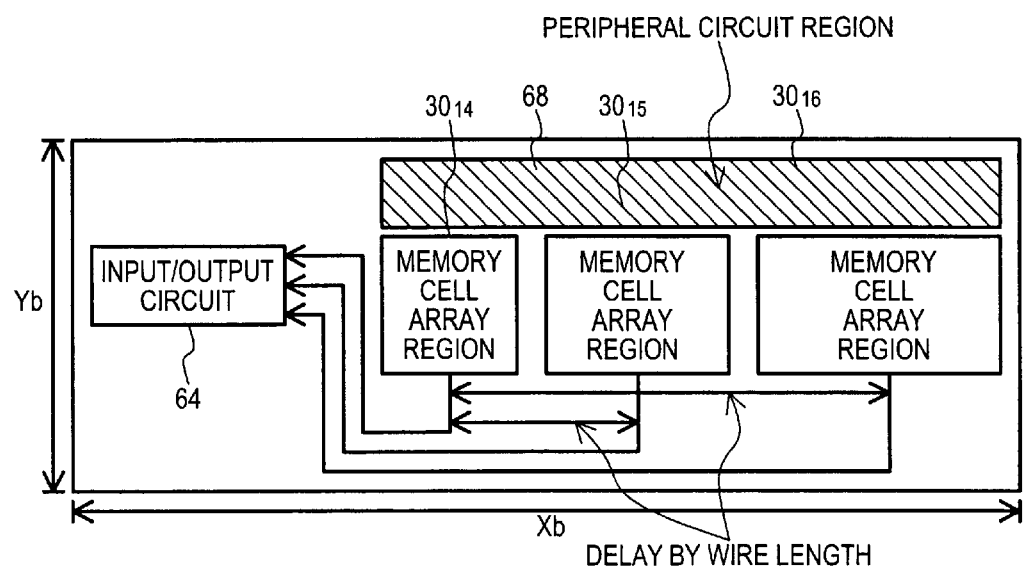
FIG. 25 is a plan view of a semiconductor memory device composed of a very large integrated circuit according to an embodiment.

FIG. 25 is a plan view of a semiconductor memory device composed of a very large integrated circuit according to an embodiment. The semiconductor memory device of FIG. 24 includes memory cell array regions ($30_{14}$ to $30_{16}$) in which the current drive of memory cells 11 in memory cell array region ($30_{15}$ and $30_{16}$) may be increased by increasing a size of memory cells 11 in a row direction X. In the embodiment of FIG. 25, a length of a data carrying wire to an input/output circuit 64 from memory cell array regions ($30_{14}$ to $30_{16}$) at a worst case may be long compared to the embodiment of FIG. 24. However, the arrangement of a peripheral circuit region may be such that interconnections are more efficient due to the memory cell array regions ($30_{14}$ to $30_{16}$) having essentially the same dimension in a column direction Y.

When a plurality of memory cell array regions ($30_{11}$ to $30_{13}$ or $30_{14}$ to $30_{16}$) are provided as illustrated in FIGS. 24 and 25, the respective wire distance to input/output circuit 64 from memory cell array regions ($30_{11}$ to $30_{13}$ or $30_{14}$ to $30_{16}$) may vary. The variation in resistance and capacitance in accordance with wire length may create a data signal propagation time difference to input/output circuit 64. However, by employing distal memory cells 11B as illustrated in FIGS. 6 and/or 18 in memory cell array regions ($30_{12}$ and $30_{13}$ and $30_{15}$ and $30_{16}$) on a side distal to input/output circuit 64, the current drive performance of memory cells 11 may be improved in a memory cell array regions ($30_{12}$ and $30_{13}$ and $30_{15}$ and $30_{16}$). In this way, compensation may be provided for a data signal propagation time difference to input/output circuit 64 in accordance with a distance to a memory cell array region ($30_{11}$ to $30_{13}$ or $30_{14}$ to $30_{16}$) in which a memory cell is selected. Select circuit regions 31 may include select circuits 12 that may be designed in accordance with a pitch of memory cells in a row that are connected thereto. Likewise, reading circuit regions 33 may include reading circuits 13 that may be designed in accordance with a pitch of memory cells in a column that are connected thereto.

Figure 26:
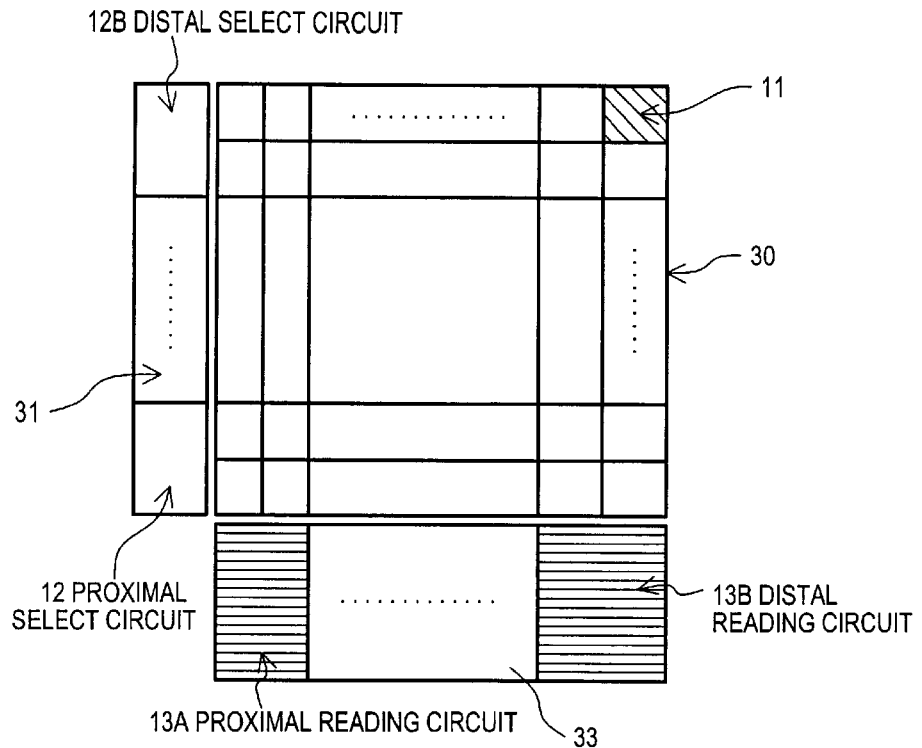
FIG. 26 is a plan view of a semiconductor memory device according to an embodiment.

Referring now to FIG. 26, a plan view of a semiconductor memory device according to an embodiment is set forth. The embodiment of FIG. 26 may simultaneously remedy a data signal propagation delay due to bit line resistance and word line resistance as described in previous embodiments.

The size and pitch of a reading circuit 13 and a select circuit 12 may be a combination of a wire arrangement of an embodiment illustrated in FIGS. 9 and 10 and a wire arrangement structure of an embodiment illustrated in FIGS. 21 and 22.

Figure 27:
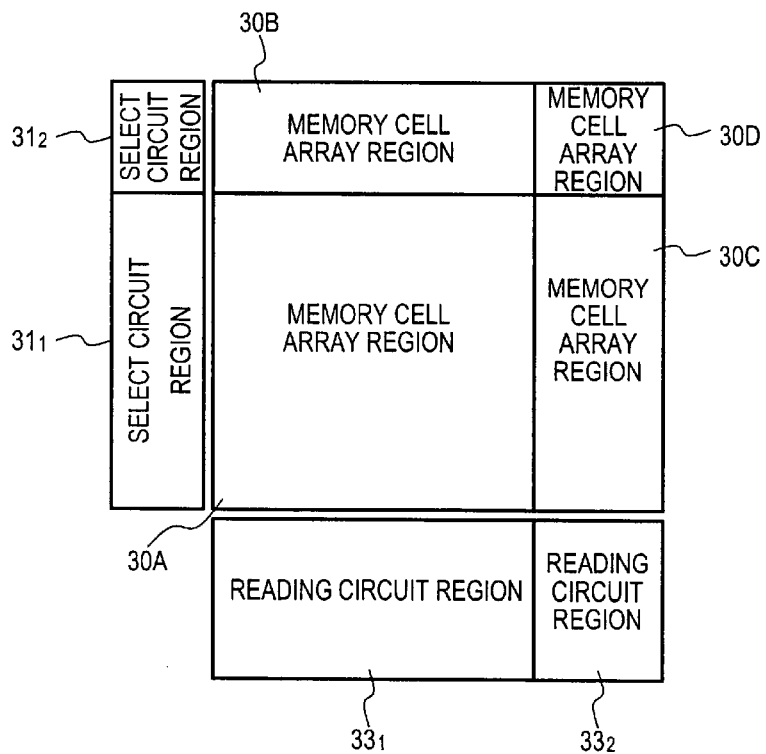
FIG. 27 is a plan view illustrating how a memory cell array region, a select circuit region, and a reading circuit region of FIG. 26 may be divided according to an embodiment.

FIG. 27 is a plan view illustrating how a memory cell array region 30, a select circuit region 31, and reading circuit region 33 of FIG. 26 may be divided.

The semiconductor memory device illustrated in FIG. 26 may include a memory cell array region 30 divided into memory cell array regions (30A to 30D) as illustrated in FIG. 27. Select circuit region 31 may be divided into select circuit regions ($31_1$ and $31_2$). Reading circuit region 33 may be divided into reading circuit regions ($33_1$ and $33_2$). Memory cell array region 30A may have a proximal memory cell 11A with a structure as illustrated in FIG. 4. Memory cell array region 30B may have a distal memory cell 11B with a structure as illustrated in FIG. 6. Memory cell array region 30C may have a distal memory cell 11B with a structure as illustrated in FIG. 18. Memory cell array region 30D may have a memory cell 11 designed to have a length in the column direction Y essentially matching a length Yb of distal memory cell 11B provided in memory cell array region 30B and a length in the row direction X essentially matching a length Xc of distal memory cell 11B provided in memory cell array region 30C. In this way, a drive strength of a memory cell 11 in memory cell array region 30D may be increased.

In the embodiment of FIGS. 26 and 27, a propagation delay time that may depend on a position of a selected memory cell 11 may be reduced throughout all memory cell array regions. With memory cell array regions (30A to 30D) configured as described above, select circuit regions ($31_1$ and $31_2$) may include select circuits 12 that may be designed in accordance with a pitch of memory cells in a row that are connected thereto. Likewise, reading circuit regions ($33_1$ and $33_2$) may include reading circuits 13 that may be designed in accordance with a pitch of memory cells in a column that are connected thereto.

In accordance with the above embodiments, taking circuit characteristics into account, a difference in signal propagation delay between a distal end and a proximal end may be reduced. In this way, overall speed may be improved as compared to a conventional approach while reducing an increase in chip area and manufacturing costs. For example, a reading circuit region 33 of an embodiment in accordance with FIG. 3 may take up about 4% of an entire chip. However, a reading circuit region 33 may take up about 8% of chip size if bit lines are divided into two to improve speed as in a conventional approach. This is an increase in chip size of about 4%. In current technology, about 1400 chips may be manufactured if a wafer of 15.24 cm in diameter is used. Thus, about 50 more chips may be manufactured. Thus, desirable effects may be obtained both in terms of improvement of operation speed and reduction of manufacturing costs.

In the embodiments, the current drive performance of distal side memory cells 11B may be enhanced by increasing gate widths of n-type IGFETs (41a, 41b, 43a, and 43b) of each distal memory cell 11B. Otherwise, a similar effect may be obtained by an alternative structure. Gate lengths of n-type IGFETs (41a, 41b, 43a, and 43b) of each distal memory cell 11B may be set shorter than gate lengths of n-type IGFETs (41a, 41b, 43a, and 43b) of each proximal memory cell 11A. By doing so, similar effects may be obtained.

Alternatively, an impurity doping amount in channel regions of n-type IGFETs (41a, 41b, 43a, and 43b) in a distal memory cell 11 may be set different from an impurity doping amount in channel regions of n-type IGFETs (41a, 41b, 43a, and 43b) in a proximal memory cell 11. In this way, a current drive performance of a distal memory cell 11 may be altered without changing the size of the distal memory cell 11.

Figure 28:
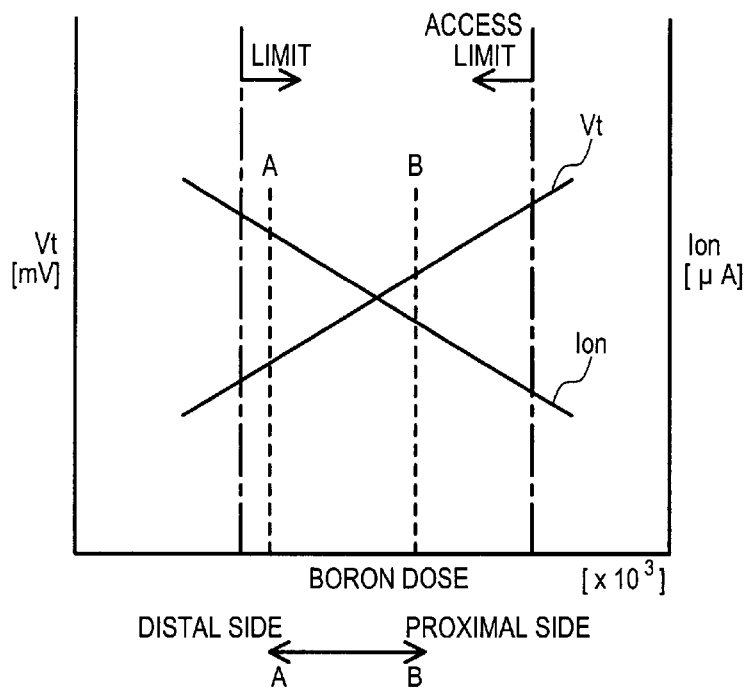
FIG. 28 is a graph showing a correlation between impurity doping amount and a threshold voltage according to an embodiment.

FIG. 28 is a graph showing a correlation between impurity doping amount and a threshold voltage according to an embodiment. In the graph of FIG. 28, the axis of abscissa shows a dose of the amount of doping the channel regions of n-type IGFETs with boron and the axis of ordinate shows the threshold voltage Vt changed in accordance with the doping amount and a current value Ion flowing when a transistor is a n-type IGFET is turned on. A state in which the current value Ion is high is a "high current drive performance state" and a state in which the current value Ion is low is a "low current drive performance state". In the drawing, A may represent the impurity doping amount for a distal side memory cell and B may represent the impurity doping amount for a proximal side memory cell. It can be seen that a distal side memory cell may have a lower threshold voltage Vt and a higher current value Ion than a proximal side memory cell.

It is understood from the graph that as the amount of doping of boron in channel regions is increased, the threshold voltage Vt may become higher and a current value Ion may become lower as may be preferable for a proximal memory cell. The graph may also show that as the amount of doping of boron in channel regions is decreased, the threshold voltage Vt may become lower and a current value Ion may become higher as may be preferable for a distal memory cell.

Alternatively, channel regions may be doped with phosphorus as an impurity. In this case, if a channel region doping amount of n-type IGFETs in the distal memory cell is set higher than the channel region doping amount of the n-type IGFETs in the proximal memory cell, the threshold voltage Vt of n-type IGFETs in the distal memory cell may be reduced and a current value Ion may be raised.

A semiconductor memory device according to the embodiments may be a SRAM, for example. However, the present invention is not limited thereto and semiconductor memory devices to which the present invention may be applied may include DRAM (Dynamic Random Access Memory), Flash memory, ROM (Read Only Memory), FeRAM (Ferroelectric Random Access Memory), MRAM (Magnetoresistive Random Access Memory), and the like. According to the embodiments, circuit characteristics may be improved, chip size may be reduced, and operation current may be reduced. In this way, a semiconductor memory device according to the embodiments may have a lower cost and higher performance as compared to a conventional memory device.

The position and configuration of circuits to be connected to a memory cell array are not limited to those in the above embodiments. For instance, instead of configuration as shown in FIGS. 3, 20, and 26, a configuration which may include select circuit regions 31, or reading circuit regions 33 opposing to each other so as to sandwich a memory cell region may be used in a semiconductor memory device.

Figure 29:
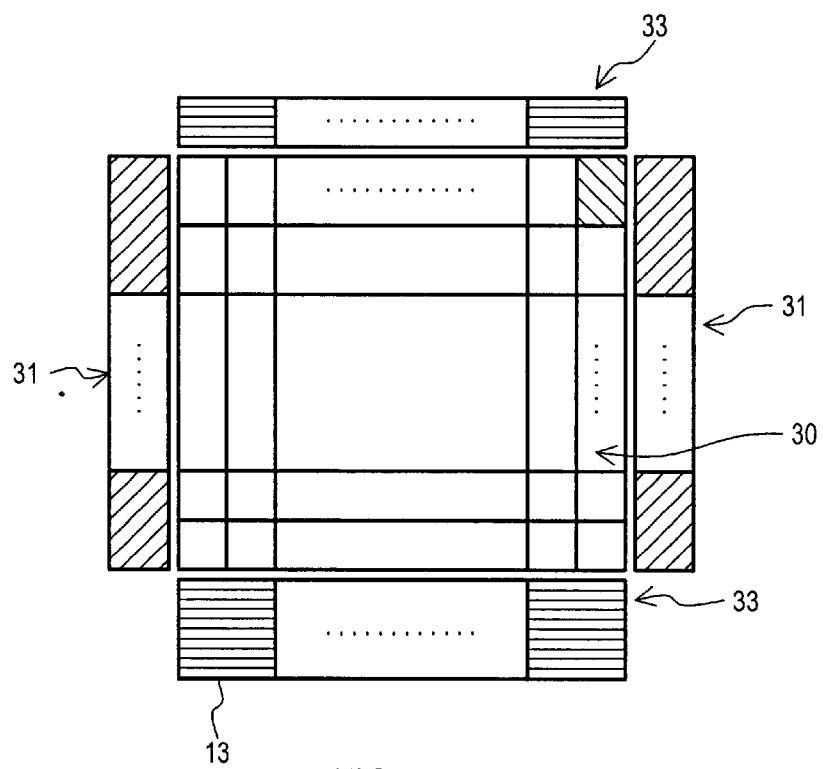
FIG. 29 is a plan view of a semiconductor memory device according to an embodiment.

FIG. 29 is a plan view of a semiconductor memory device according to an embodiment. In FIG. 29, select circuit regions 31 are disposed on opposite sides of a memory cell region 30 and reading circuit regions 33 are disposed on opposite sides of a memory cell region 30. In such a case, effects similar to the embodiments described above may be obtained.

According to the embodiments, a difference in reading speed between distal side memory cells and proximal side memory cells may be reduced while reducing an increase in chip size as compared to conventional approaches.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   a plurality of word lines disposed in a row direction;
   a plurality of bit lines disposed in a column direction;

a plurality of memory cells placed at intersections of the plurality of bit lines and the plurality of word lines, each memory cell connected to one of the plurality of word lines and one of the plurality of bit lines;

select circuits coupled to the word lines to select memory cells;

reading circuits connected to the bit lines to read data from the selected memory cells wherein of a group of memory cells connected to the same one of the plurality of word lines, the current drive performance of distal side memory cells positioned far from the select circuits is set higher than the current drive performance of proximal side memory cells positioned near the select circuits.

2. The semiconductor memory device according to claim 1, wherein:

each distal side memory cell includes insulated gate field effect transistors (IGFETs) that have larger gate widths than corresponding IGFETs in the proximal side memory cells.

3. The semiconductor memory device according to claim 1, wherein:

each distal side memory cell includes insulated gate field effect transistors (IGFETs) that have shorter gate lengths than corresponding IGFETs in the proximal side memory cells.

4. The semiconductor memory device according to claim 1, wherein:

each distal side memory cell includes insulated gate field effect transistors (IGFETs) that have channel regions doped with an impurity at a different impurity concentration than corresponding IGFETs in the proximal side memory cells.

5. The semiconductor memory device according to claim 4, wherein:

the impurity includes boron and the impurity concentration is lower in the IGFETs in the distal side memory cells than in the corresponding IGFETs in the proximal side memory cells.

6. The semiconductor memory device according to claim 4, comprising:

the impurity includes phosphorus and the impurity concentration is higher in the IGFETs in the distal side memory cells than in the corresponding IGFETs in the proximal side memory cells.

7. The semiconductor memory device according to claim 1, further including:

the plurality of memory cells are included in a memory cell array region; and a connection adjusting region provided between the memory cell array region and the select circuits, the connection adjusting region connecting wires included in each select circuit with wires included in the memory cell array region after adjusting the positions of the wire in accordance with a pitch of the memory cells.

8. A semiconductor memory device, comprising:

a plurality of word lines disposed in a row direction;

a plurality of bit lines disposed in a column direction;

a plurality of memory cells placed at intersections of the plurality of bit lines and the plurality of word lines, each memory cell connected to one of the plurality of word lines and one of the plurality of bit lines;

select circuits coupled to the word lines to select memory cells;

reading circuits connected to the bit lines to read data from the selected memory cells wherein of a group of memory cells connected to the same one of the plurality of bit lines, the current drive performance of distal side memory cells positioned far from the reading circuits is set higher than the current drive performance of proximal side memory cells positioned near the reading circuits.

9. The semiconductor memory device according to claim 8, wherein:

each distal side memory cell includes insulated gate field effect transistors (IGFETs) that have larger gate widths than corresponding IGFETs in the proximal side memory cells.

10. The semiconductor memory device according to claim 8, wherein:

each distal side memory cell includes insulated gate field effect transistors (IGFETs) that have shorter gate lengths than corresponding IGFETs in the proximal side memory cells.

11. The semiconductor memory device according to claim 8, wherein:

each distal side memory cell includes insulated gate field effect transistors (IGFETs) that have channel regions doped with an impurity at a different impurity concentration than corresponding IGFETs in the proximal side memory cells.

12. The semiconductor memory device according to claim 11, wherein:

the impurity includes boron and the impurity concentration is lower in the IGFETs in the distal side memory cells than in the corresponding IGFETs in the proximal side memory cells.

13. The semiconductor memory device according to claim 11, wherein:

the impurity includes phosphorus and the impurity concentration is higher in the IGFETs in the distal side memory cells than in the corresponding IGFETs in the proximal side memory cells.

14. The semiconductor memory device according to claim 8, wherein:

the plurality of memory cells are included in a memory cell array region; and a connection adjusting region provided between the memory cell array region and the reading circuits, the connection adjusting region connecting wires included in each reading circuit with wires included in the memory cell array region after adjusting the positions of the wire in accordance with a pitch of the memory cells.

15. A semiconductor memory device, comprising:

an output circuit coupled to receive data from a plurality of memory cell array regions;

the plurality of memory cell array regions including a proximal memory cell array region and a distal memory cell array region with respect to the output circuit;

the proximal memory cell array region includes a plurality of proximal memory cells and the distal memory cell array region includes a plurality of distal memory cells wherein the current drive performance of distal memory cells is set higher than the current drive performance of proximal memory cells.

16. The semiconductor memory device according to claim 15, wherein:

each of the plurality of distal memory cells have a pitch in a bit line direction larger than the pitch in a bit line direction of each of the plurality of proximal memory cells.

17. The semiconductor memory device according to claim 15, wherein:
   each of the plurality of distal memory cells have a pitch in a word line direction larger than the pitch in a word line direction of each of the plurality of proximal memory cells.

18. The semiconductor memory device according to claim 15, wherein:
   each of the plurality of distal memory cells includes insulated gate field effect transistors (IGFETs) that have larger gate widths than corresponding IGFETs in each of the plurality of proximal memory cells.

19. The semiconductor memory device according to claim 15, wherein:
   the semiconductor memory device is a static random access memory.

20. The semiconductor memory device according to claim 15, wherein:
   each of the plurality of distal memory cells includes insulated gate field effect transistors (IGFETs) that have channel regions doped with an impurity at a different impurity concentration than corresponding IGFETs in each of the plurality of proximal memory cells.

* * * * *